United States Patent
Zhang et al.

(10) Patent No.: US 11,908,494 B2
(45) Date of Patent: Feb. 20, 2024

(54) CONTROLLING STATUS INDICATORS FOR DRIVE BAYS OF A DRIVE BAY ENCLOSURE OF A STORAGE SYSTEM

(71) Applicant: Dell Products L.P., Round Rock, TX (US)

(72) Inventors: Zhuo Zhang, Shanghai (CN); Xiangdong Huang, Shanghai (CN); Changlin Li, Shanghai (CN); Yan Sun, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 508 days.

(21) Appl. No.: 17/169,784

(22) Filed: Feb. 8, 2021

(65) Prior Publication Data
US 2022/0240405 A1    Jul. 28, 2022

(30) Foreign Application Priority Data
Jan. 26, 2021  (CN) .......................... 202110107145.1

(51) Int. Cl.
*G11B 33/12* (2006.01)
*H05K 7/14* (2006.01)

(52) U.S. Cl.
CPC .......... *G11B 33/128* (2013.01); *G11B 33/124* (2013.01); *H05K 7/1434* (2013.01)

(58) Field of Classification Search
CPC .. G11B 33/128; G11B 33/124; H05K 7/1434; G06F 11/325; G06F 11/2089
See application file for complete search history.

(56) References Cited

U.S. PATENT DOCUMENTS

| | | | | |
|---|---|---|---|---|
| 5,586,250 A | * | 12/1996 | Carbonneau | G06F 21/86 714/48 |
| 5,612,927 A | * | 3/1997 | Morrison | G11B 33/124 360/99.07 |
| 6,475,016 B1 | * | 11/2002 | Heidenreich | G11B 33/124 439/157 |
| 2003/0067697 A1 | * | 4/2003 | Weinstein | G11B 20/1816 |

(Continued)

FOREIGN PATENT DOCUMENTS

WO    WO-9600938 A1 *  1/1996 ............. G06F 1/184

OTHER PUBLICATIONS

Oracle, "Oracle Server X5-2 Service Manual," Part No. E48320-10, Jan. 2021, 306 pages.

(Continued)

*Primary Examiner* — Charles Rones
*Assistant Examiner* — Hewy H Li
(74) *Attorney, Agent, or Firm* — Ryan, Mason & Lewis, LLP

(57) ABSTRACT

An apparatus comprises at least one processing device comprising a processor coupled to a memory and a drive bay enclosure of a storage system comprising a housing with one or more drive bays, the housing of the drive bay enclosure comprising one or more status indicators proximate an opening for at least a given one of the one or more drive bays. The at least one processing device is configured to perform steps of determining status information for the given drive bay, and controlling the one or more status indicators proximate the opening for the given drive bay based at least in part on the determined status information.

20 Claims, 18 Drawing Sheets

(56) References Cited

U.S. PATENT DOCUMENTS

| | | | | |
|---|---|---|---|---|
| 2005/0076178 A1* | 4/2005 | Coppock | ............... | G06F 11/325 |
| | | | | 711/170 |
| 2009/0016009 A1* | 1/2009 | Barrall | .................... | G06F 1/187 |
| 2013/0070415 A1* | 3/2013 | Terry | ................... | G11B 33/124 |
| | | | | 361/679.38 |

OTHER PUBLICATIONS

Hewlett Packard Enterprise, "HPE ProLiant DL380 Gen10 Server," Quick Specs Overview, Feb. 1, 2021, 89 pages.

* cited by examiner

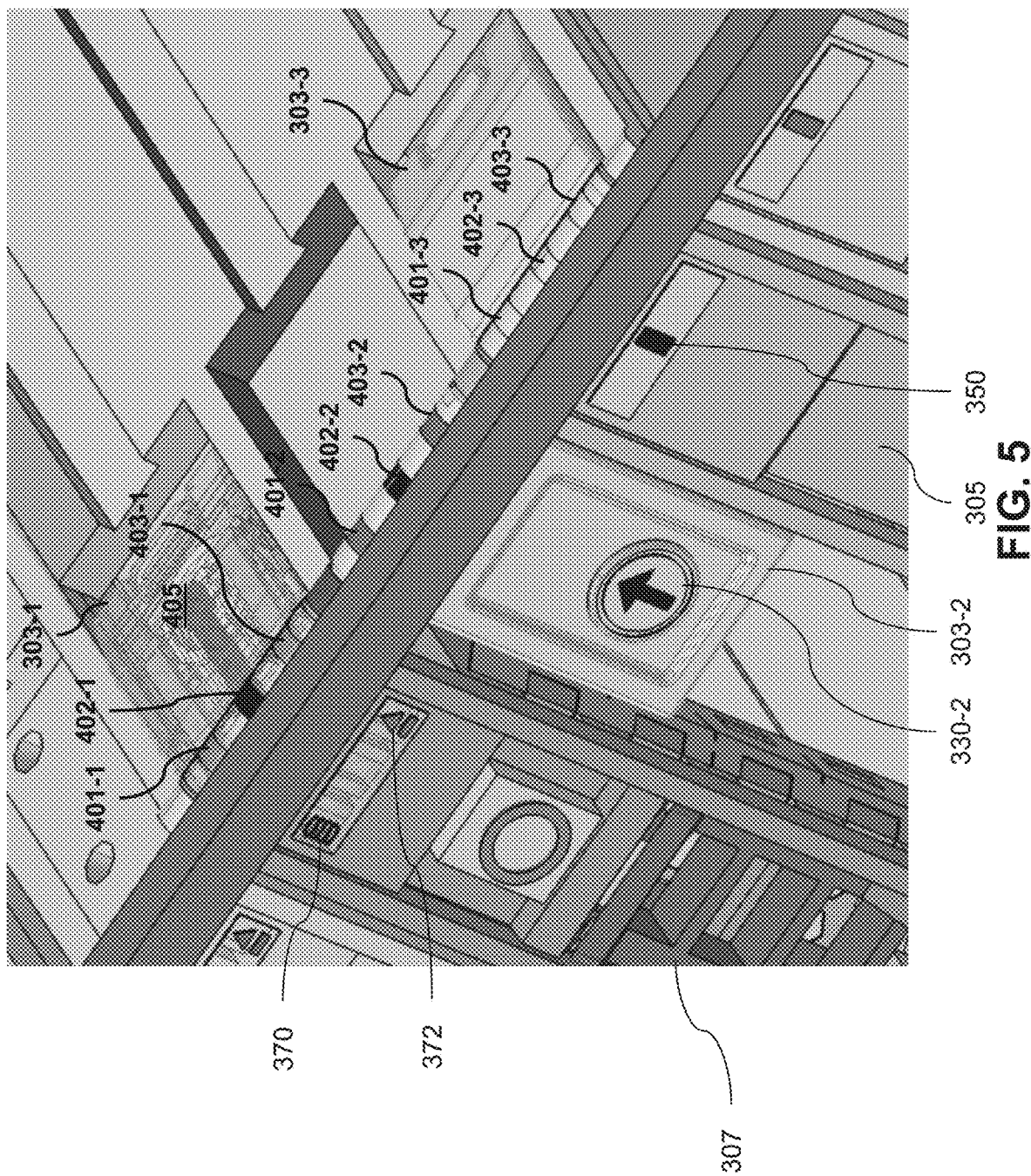

CONTROLLING STATUS INDICATORS FOR DRIVE BAYS OF A DRIVE BAY ENCLOSURE OF A STORAGE SYSTEM

RELATED APPLICATION

The present application claims priority to Chinese Patent Application No. 202110107145.1, filed on Jan. 26, 2021 and entitled "Controlling Status Indicators for Drive Bays of a Drive Bay Enclosure of a Storage System," which is incorporated by reference herein in its entirety.

FIELD

The field relates generally to information processing, and more particularly to storage in information processing systems.

BACKGROUND

Storage arrays and other types of storage systems are often shared by multiple host devices over a network. Applications running on the host devices each include one or more processes that perform the application functionality. Such processes issue input-output (TO) operation requests for delivery to the storage systems. Storage controllers of the storage systems service such requests for IO operations. In some information processing systems, a storage system may include one or more drive bays in which storage devices may be hot-swapped into and out of the storage system.

SUMMARY

Illustrative embodiments of the present disclosure provide techniques for controlling status indicators for drive bays of a drive bay enclosure of a storage system.

In one embodiment, an apparatus comprises at least one processing device comprising a processor coupled to a memory and a drive bay enclosure of a storage system comprising a housing with one or more drive bays, the housing of the drive bay enclosure comprising one or more status indicators proximate an opening for at least a given one of the one or more drive bays. The at least one processing device is configured to perform steps of determining status information for the given drive bay, and controlling the one or more status indicators proximate the opening for the given drive bay based at least in part on the determined status information.

These and other illustrative embodiments include, without limitation, methods, apparatus, networks, systems and processor-readable storage media.

BRIEF DESCRIPTION OF THE DRAWINGS

FIG. 5 shows a perspective view of a drive enclosure with turnover plates, filler plates and drive trays installed in drive bays thereof in an illustrative embodiment.

DETAILED DESCRIPTION

Illustrative embodiments will be described herein with reference to exemplary information processing systems and associated computers, servers, storage devices and other processing devices. It is to be appreciated, however, that embodiments are not restricted to use with the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other type of cloud-based system that includes one or more clouds hosting tenants that access cloud resources.

Figure 1:
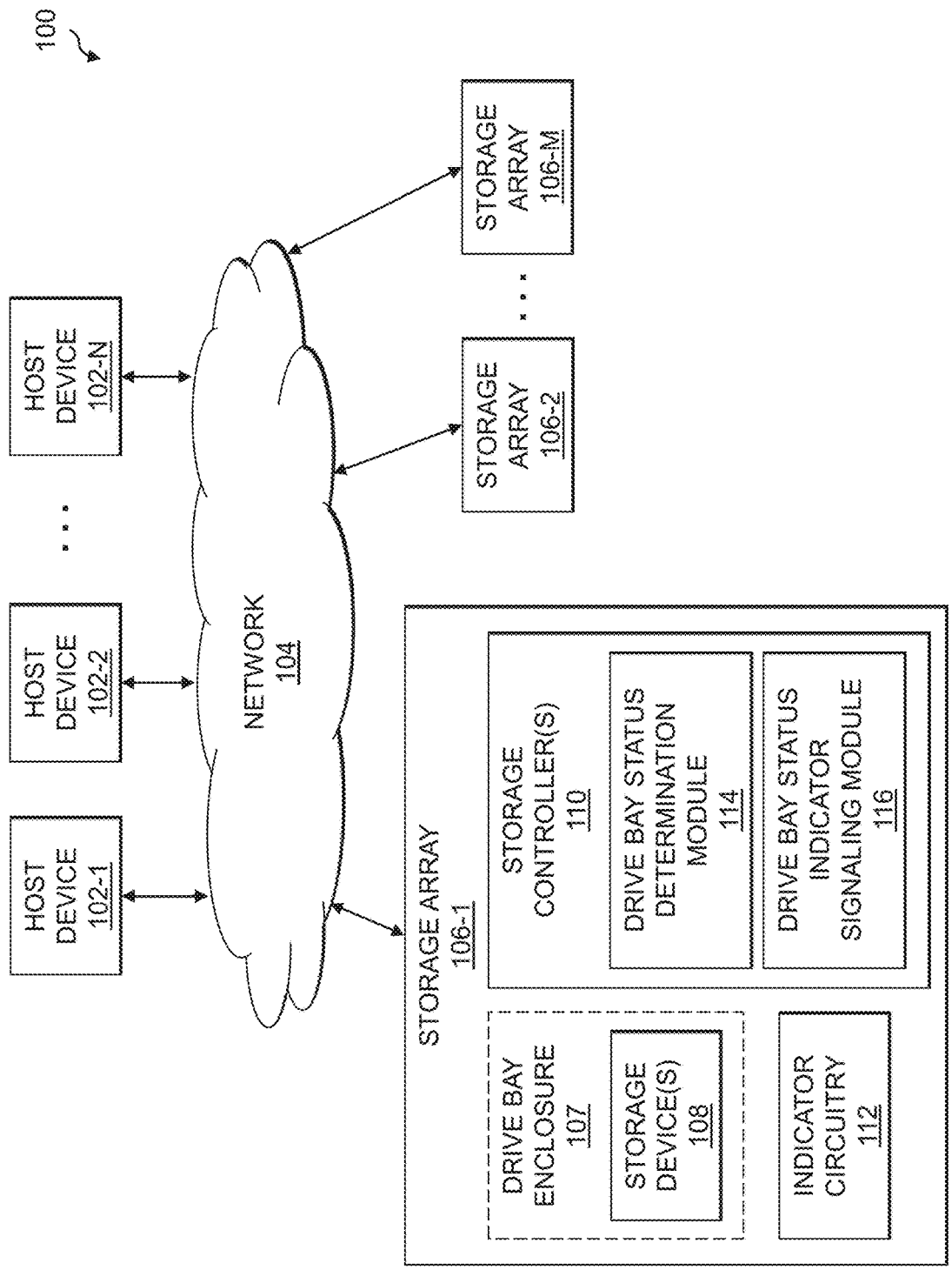
FIG. 1 is a block diagram of an information processing system for controlling status indicators for drive bays of a drive bay enclosure of a storage system in an illustrative embodiment.

FIG. 1 shows an information processing system 100 configured in accordance with an illustrative embodiment to provide functionality for indicating drive status of drive bays in a drive enclosure of a storage system. The information processing system 100 comprises one or more host devices 102-1, 102-2, . . . 102-N (collectively, host devices 102) that communicate over a network 104 with one or more storage arrays 106-1, 106-2, . . . 106-M (collectively, storage arrays 106). The network 104 may comprise a storage area network (SAN).

The storage array 106-1, as shown in FIG. 1, comprises one or more storage devices 108 that are inserted into a drive bay enclosure 107. The drive bays of the drive bay enclosure 107 are assumed to comprise hot-swappable drive bays in which the storage devices 108 are mounted or otherwise inserted. The storage devices 108 each store data utilized by one or more applications running on the host devices 102. The storage devices 108 are illustratively arranged in one or more storage pools, such as one or more software-defined storage (SDS) storage pools. The storage array 106-1 also comprises one or more storage controllers 110 that facilitate IO processing for the storage devices 108. The storage array 106-1 and its associated storage devices 108 are an example of what is more generally referred to herein as a "storage system." This storage system in the present embodiment is shared by the host devices 102, and is therefore also referred to herein as a "shared storage system." In embodiments where there is only a single host device 102, the host device 102 may be configured to have exclusive use of the storage system.

The host devices 102 illustratively comprise respective computers, servers or other types of processing devices capable of communicating with the storage arrays 106 via the network 104. For example, at least a subset of the host devices 102 may be implemented as respective virtual machines of a compute services platform or other type of processing platform. The host devices 102 in such an arrangement illustratively provide compute services such as execution of one or more applications on behalf of each of one or more users associated with respective ones of the host devices 102.

The term "user" herein is intended to be broadly construed so as to encompass numerous arrangements of human, hardware, software or firmware entities, as well as combinations of such entities.

Compute and/or storage services may be provided for users under a Platform-as-a-Service (PaaS) model, an Infrastructure-as-a-Service (IaaS) model and/or a Function-as-a-Service (FaaS) model, although it is to be appreciated that numerous other cloud infrastructure arrangements could be used. Also, illustrative embodiments can be implemented outside of the cloud infrastructure context, as in the case of a stand-alone computing and storage system implemented within a given enterprise.

The storage devices 108 of the storage array 106-1 may implement logical units (LUNs) configured to store objects for users associated with the host devices 102. These objects can comprise files, blocks or other types of objects. The host devices 102 interact with the storage array 106-1 utilizing read and write commands as well as other types of commands that are transmitted over the network 104. Such commands in some embodiments more particularly comprise Small Computer System Interface (SCSI) commands, although other types of commands can be used in other embodiments. A given IO operation as that term is broadly used herein illustratively comprises one or more such commands. References herein to terms such as "input-output" and "IO" should be understood to refer to input and/or output. Thus, an IO operation relates to at least one of input and output.

Also, the term "storage device" as used herein is intended to be broadly construed, so as to encompass, for example, a logical storage device such as a LUN or other logical storage volume. A logical storage device can be defined in the storage array 106-1 to include different portions of one or more physical storage devices. Storage devices 108 may therefore be viewed as comprising respective LUNs or other logical storage volumes.

In the information processing system 100 of FIG. 1, multiple ones of the storage arrays 106 may be part of a storage cluster, and the host devices 102 may submit IO operations to be processed by the storage cluster. The storage cluster may comprise or provide an SDS system with one or more SDS storage pools. The storage controller 110 of storage array 106-1 is assumed to implement functionality for indicating drive bay status for drive bays of the drive bay enclosure 107 utilizing indicator circuitry 112. The indicator circuitry 112 may comprise one or more lights (e.g., light-emitting diodes (LEDs)) or other visual indicators of the status of drive bays of the drive bay enclosure 107. The indicator circuitry 112, or at least a portion thereof such as one or more LEDs, are arranged within a housing of the drive bay enclosure 107 so as to be visible when activated behind turnover plates, filler plates and drive tray plates installed for the drive bays. The storage controllers 110 provide the functionality for indicating drive bay status for drive bays of the drive bay enclosure 107 utilizing a drive bay status determination module 114 and a drive bay status indicator signaling module 116. The drive bay status determination module 114 is configured to determine status information for respective ones of the drive bays of the drive bay enclosure 107. Such status information may include, but is not limited to, determining whether a given storage bay is ready for adding a storage device, whether an installed storage device matches storage system specifications (e.g., for use in one or more SDS storage pools), whether data errors have occurred, whether an installed storage device is a member of an SDS storage pool, whether operations for a SDS storage pool are ongoing for an installed storage device, whether an installed storage device is ready for removal or replacement, etc. The drive bay status indicator signaling module 116 is configured to control one or more status indicators (e.g., indicator circuitry 112) mounted on the housing of the drive bay enclosure 107 proximate openings for drive bays thereof based at least in part on the determined status information for such drive bays.

At least portions of the functionality of the drive bay status determination module 114 and the drive bay status indicator signaling module 116 may be implemented at least in part in the form of software that is stored in memory and executed by a processor.

Although shown as being implemented internal to the storage controllers 110 of the storage array 106-1, it should be appreciated that the drive bay status determination module 114 and the drive bay status indicator signaling module 116 in other embodiments may be implemented at least in part external to the storage controllers 110, including at least partially external to the storage array 106-1 such as within one or more of the host devices 102, one or more other ones of the storage arrays 106-2 through 106-M, one or more external servers, etc.

The host devices 102, storage arrays 106 and storage controllers 110 implementing the drive bay status determination module 114 and the drive bay status indicator signaling module 116 in the FIG. 1 embodiment are assumed to be implemented using at least one processing platform, with each processing platform comprising one or more processing devices each having a processor coupled to a memory. Such processing devices can illustratively include particular arrangements of compute, storage and network resources. For example, processing devices in some embodiments are implemented at least in part utilizing virtual resources such as virtual machines (VMs) or Linux containers (LXCs), or combinations of both as in an arrangement in which Docker containers or other types of LXCs are configured to run on VMs.

The host devices 102, the storage arrays 106 and the storage controllers 110 implementing the drive bay status determination module 114 and the drive bay status indicator signaling module 116 may be implemented on respective distinct processing platforms, although numerous other arrangements are possible. For example, in some embodiments at least portions of one or more of the host devices 102, the storage arrays 106 and the storage controllers 110 implementing the drive bay status determination module 114 and the drive bay status indicator signaling module 116 are implemented on the same processing platform. The storage controllers 110 implementing the drive bay status determination module 114 and the drive bay status indicator signaling module 116, one or more of the storage arrays 106, or combinations thereof, can therefore be implemented at least in part within at least one processing platform that implements at least a subset of the host devices 102.

The network 104 may be implemented using multiple networks of different types to interconnect storage system components. For example, the network 104 may comprise a SAN that is a portion of a global computer network such as the Internet, although other types of networks can be part of the SAN, including a wide area network (WAN), a local area network (LAN), a satellite network, a telephone or cable network, a cellular network, a wireless network such as a WiFi or WiMAX network, or various portions or combinations of these and other types of networks. The network 104 in some embodiments therefore comprises combinations of multiple different types of networks each comprising processing devices configured to communicate using Internet Protocol (IP) or other related communication protocols.

As a more particular example, some embodiments may utilize one or more high-speed local networks in which associated processing devices communicate with one another utilizing Peripheral Component Interconnect express (PCIe) cards of those devices, and networking protocols such as InfiniBand, Gigabit Ethernet or Fibre Channel. Numerous alternative networking arrangements are possible in a given embodiment, as will be appreciated by those skilled in the art.

Although in some embodiments certain commands used by the host devices 102 to communicate with the storage arrays 106 illustratively comprise SCSI commands, other types of commands and command formats can be used in other embodiments. For example, some embodiments can implement IO operations utilizing command features and functionality associated with NVM Express (NVMe), as described in the NVMe Specification, Revision 1.3, May 2017, which is incorporated by reference herein. Other storage protocols of this type that may be utilized in illustrative embodiments disclosed herein include NVMe over Fabric, also referred to as NVMeoF, and NVMe over Transmission Control Protocol (TCP), also referred to as NVMe/TCP.

The storage array 106-1 in the present embodiment is assumed to comprise a persistent memory that is implemented using a flash memory or other type of non-volatile memory of the storage array 106-1. More particular examples include NAND-based flash memory or other types of non-volatile memory such as resistive RAM, phase change memory, spin torque transfer magneto-resistive RAM (STT-MRAM) and Intel Optane™ devices based on 3D XPoint™ memory. The persistent memory is further assumed to be separate from the storage devices 108 of the storage array 106-1, although in other embodiments the persistent memory may be implemented as a designated portion or portions of one or more of the storage devices 108. For example, in some embodiments the storage devices 108 may comprise flash-based storage devices, as in embodiments involving all-flash storage arrays, or may be implemented in whole or in part using other types of non-volatile memory.

As mentioned above, communications between the host devices 102 and the storage arrays 106 may utilize PCIe connections or other types of connections implemented over one or more networks. For example, illustrative embodiments can use interfaces such as Internet SCSI (iSCSI), Serial Attached SCSI (SAS) and Serial ATA (SATA). Numerous other interfaces and associated communication protocols can be used in other embodiments.

The storage arrays 106 in some embodiments may be implemented as part of a cloud-based system.

The storage devices 108 of the storage array 106-1 can be implemented using solid state drives (SSDs). Such SSDs are implemented using non-volatile memory (NVM) devices such as flash memory. Other types of NVM devices that can be used to implement at least a portion of the storage devices 108 include non-volatile random access memory (NVRAM), phase-change RAM (PC-RAM) and magnetic RAM (MRAM). These and various combinations of multiple different types of NVM devices or other storage devices may also be used. For example, hard disk drives (HDDs) can be used in combination with or in place of SSDs or other types of NVM devices. Accordingly, numerous other types of electronic or magnetic media can be used in implementing at least a subset of the storage devices 108.

The storage arrays 106 may additionally or alternatively be configured to implement multiple distinct storage tiers of a multi-tier storage system. By way of example, a given multi-tier storage system may comprise a fast tier or performance tier implemented using flash storage devices or other types of SSDs, and a capacity tier implemented using HDDs, possibly with one or more such tiers being server based. A wide variety of other types of storage devices and multi-tier storage systems can be used in other embodiments, as will be apparent to those skilled in the art. The particular storage devices used in a given storage tier may be varied depending on the particular needs of a given embodiment, and multiple distinct storage device types may be used within a single storage tier. As indicated previously, the term "storage device" as used herein is intended to be broadly construed, and so may encompass, for example, SSDs, HDDs, flash drives, hybrid drives or other types of storage products and devices, or portions thereof, and illustratively include logical storage devices such as LUNs.

As another example, the storage arrays 106 may be used to implement one or more storage nodes in a cluster storage system comprising a plurality of storage nodes interconnected by one or more networks.

It should therefore be apparent that the term "storage array" as used herein is intended to be broadly construed, and may encompass multiple distinct instances of a commercially-available storage array.

Other types of storage products that can be used in implementing a given storage system in illustrative embodiments include software-defined storage, cloud storage, object-based storage and scale-out storage. Combinations of multiple ones of these and other storage types can also be used in implementing a given storage system in an illustrative embodiment.

In some embodiments, a storage system comprises first and second storage arrays arranged in an active-active configuration. For example, such an arrangement can be used to ensure that data stored in one of the storage arrays is replicated to the other one of the storage arrays utilizing a synchronous replication process. Such data replication across the multiple storage arrays can be used to facilitate failure recovery in the system 100. One of the storage arrays may therefore operate as a production storage array relative to the other storage array which operates as a backup or recovery storage array.

It is to be appreciated, however, that embodiments disclosed herein are not limited to active-active configurations or any other particular storage system arrangements. Accordingly, illustrative embodiments herein can be configured using a wide variety of other arrangements, including, by way of example, active-passive arrangements, active-active Asymmetric Logical Unit Access (ALUA) arrangements, and other types of ALUA arrangements.

These and other storage systems can be part of what is more generally referred to herein as a processing platform comprising one or more processing devices each comprising a processor coupled to a memory. A given such processing device may correspond to one or more virtual machines or other types of virtualization infrastructure such as Docker containers or other types of LXCs. As indicated above, communications between such elements of system 100 may take place over one or more networks.

The term "processing platform" as used herein is intended to be broadly construed so as to encompass, by way of illustration and without limitation, multiple sets of processing devices and one or more associated storage systems that are configured to communicate over one or more networks. For example, distributed implementations of the host devices 102 are possible, in which certain ones of the host devices 102 reside in one data center in a first geographic location while other ones of the host devices 102 reside in one or more other data centers in one or more other geographic locations that are potentially remote from the first geographic location. The storage arrays 106 may be implemented at least in part in the first geographic location, the second geographic location, and one or more other geographic locations. Thus, it is possible in some implementations of the system 100 for different ones of the host devices 102 and the storage arrays 106 to reside in different data centers.

Numerous other distributed implementations of the host devices 102 and the storage arrays 106 are possible. Accordingly, the host devices 102 and the storage arrays 106 can also be implemented in a distributed manner across multiple data centers.

Additional examples of processing platforms utilized to implement portions of the system 100 in illustrative embodiments will be described in more detail below in conjunction with FIGS. 15 and 16.

It is to be understood that the particular set of elements shown in FIG. 1 for controlling status indicators (e.g., indicator circuitry 112) for drive bays of the drive bay enclosure 107 of the storage array 106-1 is presented by way of illustrative example only, and in other embodiments additional or alternative elements may be used. Thus, another embodiment may include additional or alternative systems, devices and other network entities, as well as different arrangements of modules and other components.

It is to be appreciated that these and other features of illustrative embodiments are presented by way of example only, and should not be construed as limiting in any way.

Figure 2:
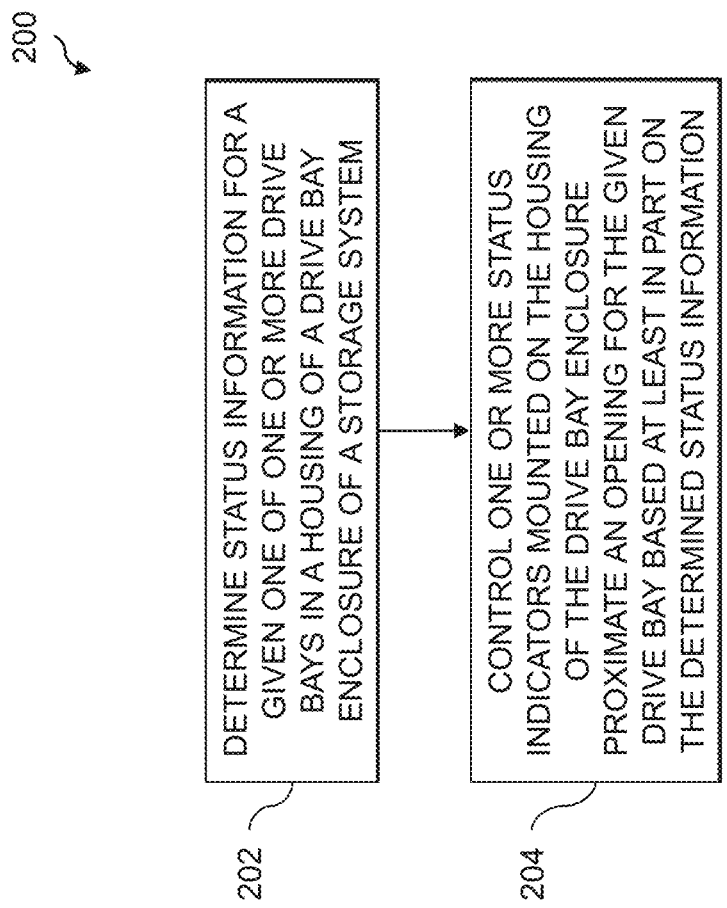
FIG. 2 is a flow diagram of an exemplary process for controlling status indicators for drive bays of a drive bay enclosure of a storage system in an illustrative embodiment.

An exemplary process 200 for controlling status indicators for drive bays of a drive bay enclosure of a storage system will now be described in more detail with reference to the flow diagram of FIG. 2. It is to be understood that this particular process is only an example, and that additional or alternative processes for controlling status indicators for drive bays of a drive bay enclosure of a storage system may be used in other embodiments.

In this embodiment, the process 200 includes steps 202 and 204. These steps are assumed to be performed by the storage controllers 110 utilizing the drive bay status determination module 114 and the drive bay status indicator signaling module 116. The process begins with step 202, determining status information for a given one of one or more drive bays in a housing of a drive bay enclosure of a storage system, the housing of the drive bay enclosure comprising one or more status indicators proximate the given drive bay. The one or more status indicators may be mounted to the housing, formed integrally with the housing, combinations thereof, etc. In step 204, the one or more status indicators proximate the opening for the given drive bay are controlled based at least in part on the status information for the given drive bay determined in step 202.

In some embodiments, the housing of the drive bay enclosure comprises a spindle housing one or more lights, and controlling the one or more status indicators in step 204 comprises selectively activating respective ones of the one or more lights housed in the spindle. The drive bay enclosure may further comprise a turnover plate rotatably mounted to the spindle proximate the opening for the given drive bay, with the turnover plate comprising at least one of the one or more status indicators. The at least one status indicator of the turnover plate is configured to passively illuminate in response to activation of one of the one or more lights housed in the spindle. The turnover plate may be configured to be rotated into a folded state when at least one of a filler plate and a drive tray plate is installed in the opening for the given drive bay, and to be rotated into an unfolded state covering at least a portion of the opening for the given drive bay when the filler plate and the drive tray plate are not installed in the opening for the given drive bay. The turnover plate may comprise a control circuit board configured for coupling to at least one of the one or more lights housed in the spindle. The drive bay enclosure may further comprise a filler plate installed in the opening for the given drive bay, where the filler plate comprises at least one of the one or more status indicators. The at least one status indicator of the filler plate is configured to passively illuminate in response to activation of one of the one or more lights housed in the spindle. The drive bay enclosure may further comprise a drive tray plate installed in the opening for the given drive bay, where the drive tray plate comprising at least one of the one or more status indicators. The at least one status indicator of the drive tray plate is configured to passively illuminate in response to activation of one of the one or more lights housed in the spindle. The drive tray plate may comprise first and second ones of the one or more status indicators.

In some embodiments, step 202 includes one or more of: determining whether the given drive bay is ready for adding a storage device, determining whether a storage device installed in the given drive bay is a member of a software-defined storage pool, determining whether a storage device installed in the given drive bay is performing one or more operations associated with a software-defined storage pool, determining whether a data error has occurred for a storage device installed in the given drive bay, determining whether a storage device installed in the given drive bay meets one or more specifications for a software-defined storage pool, and determining whether a storage device installed in the given drive bay is ready for at least one of removal and replacement. Step 204 may include selectively illuminating at least one indicator on at least one of a turnover plate and a filler plate covering the opening for the given drive bay responsive to determining that the given drive bay is ready for adding the storage device, selectively illuminating at least one indicator on a drive tray plate covering the opening for the given drive bay responsive to determining that the storage device installed in the given drive bay is a member of software-defined storage pool, selectively illuminating at least one indicator on a drive tray plate covering the opening for the given drive bay responsive to determining that the storage device installed in the given drive bay is performing the one or more operations associated with the software-defined storage pool, selectively illuminating at least one indicator on a drive tray plate covering the opening for the given drive bay responsive to determining that the data error has occurred for the storage device installed in the given drive bay, selectively illuminating at least one indicator on a drive tray plate covering the opening for the given drive bay responsive to determining that the storage device installed in the given drive bay meets the one or more specifications for the software-defined storage pool, and selectively illuminating at least one indicator on a drive tray plate covering the opening for the given drive bay responsive to determining that the storage device installed in the given drive bay is ready for at least one of removal and replacement.

Modern storage server systems may be equipped with a number of hot-swappable drive bays, on the front or rear panels, to achieve high-density storage. In data centers, SDS architectures leverage the internal storage resources on storage server systems to provide virtualized storage pools. Physical drive bay management is critical to a SDS system for scalability and serviceability. Conventional drive bay solutions, however, can only indicate limited hardware status for mounted drives. It is not easy for an IT infrastructure administrator to recognize a vacant slot, or to check the software status for each drive bay. This can give rise to incorrect manipulations and even data loss.

Illustrative embodiments provide transformable drive-indicating storage systems, which include one or more hot-swappable drive bays in a drive enclosure that is configured with indicator circuitry to indicate the software operation and running status for drives mounted in the hot-swappable drive bays. The transformable drive-indicating storage systems advantageously assist operators (e.g., end-users which add and remove storage drives from the hot-swappable drive bays of a drive enclosure) in interacting with storage management software for each of the hot-swappable drive bays in various working modes. With this approach, IT infrastructure administrators or other end-users can operate hot-swappable drive bays more easily, and the risk of maloperation will decrease significantly as well.

Generally, conventional hot-swappable drive bays are equipped with light-emitting diode (LED) indicators (e.g., a green LED and an amber LED) which are connected to a storage backplane through light pipes on the drive tray to show the status of device activity and health. However, these hardware statuses are only available for a mounted drive. Modern SDS systems require a greater variety of operational status information for both mounted and vacant hot-swappable drive bays.

The transformable drive-indicating storage system used in some embodiments includes a luminous spindle, with a turnover plate, filler plate and drive tray used in different working modes. If a storage drive is already installed in the drive bay, there are one or more software-controlled indicator lights (e.g., first and second multi-colored LEDs) on the luminous spindle of the drive tray. The software-controlled indicator lights may be turned on and off to indicate various status information for the installed storage drive. The traditional hardware indicator lights (e.g., green and amber LEDs) driven by a storage backplane are still retained at the other side of the hot-swappable drive bay. An additional software-controlled indicator light (e.g., a blue LED) is also provided on the filler plate for each vacant slot (e.g., on a newly-manufactured storage server system). If no filler plate is installed in a vacant drive bay slot, a short turnover plate with an active indicator (e.g., a blue LED) will emerge on the front of the drive bay slot.

The luminous spindle on the drive tray of the transformable drive-indicating storage system provides various features. The luminous spindle is installed inside the frame of a drive enclosure, and may be combined with a turnover plate (e.g., one for each drive bay slot that is configured to provide drive status as described herein). Thus, no extra panel room needs to be occupied to place the software-controlled indicators for the hot-swappable drive bays. If a drive or filler plate is installed in a hot-swappable drive bay, its associated turnover plate will be folded as an ordinary drive bay. If a drive and/or filler plate is removed from a hot-swappable drive bay, its associated turnover plate will turn up to play the same role of the indicator on the filler plate. A circuit board is used to control luminous rings on the luminous spindle and active indicators on the turnover plate. A set of spindle control boards is installed on the drive bay enclosure, which are able to communicate with a Baseboard Management Controller (BMC) on a server board via a serial bus connection, such as an Inter-Integrated Circuit (I²C) bus. Therefore, storage management software can control the software-controlled indicators (e.g., LEDs) on each drive bay via the in-band management channel on the BMC. Advantageously, an installed drive tray or filler plate is not required to have any electronic connections with the spindle control boards, as the software-controlled indicators will reflect light signals from the luminous rings on the luminous spindle as passive illuminants.

Figure 3A:
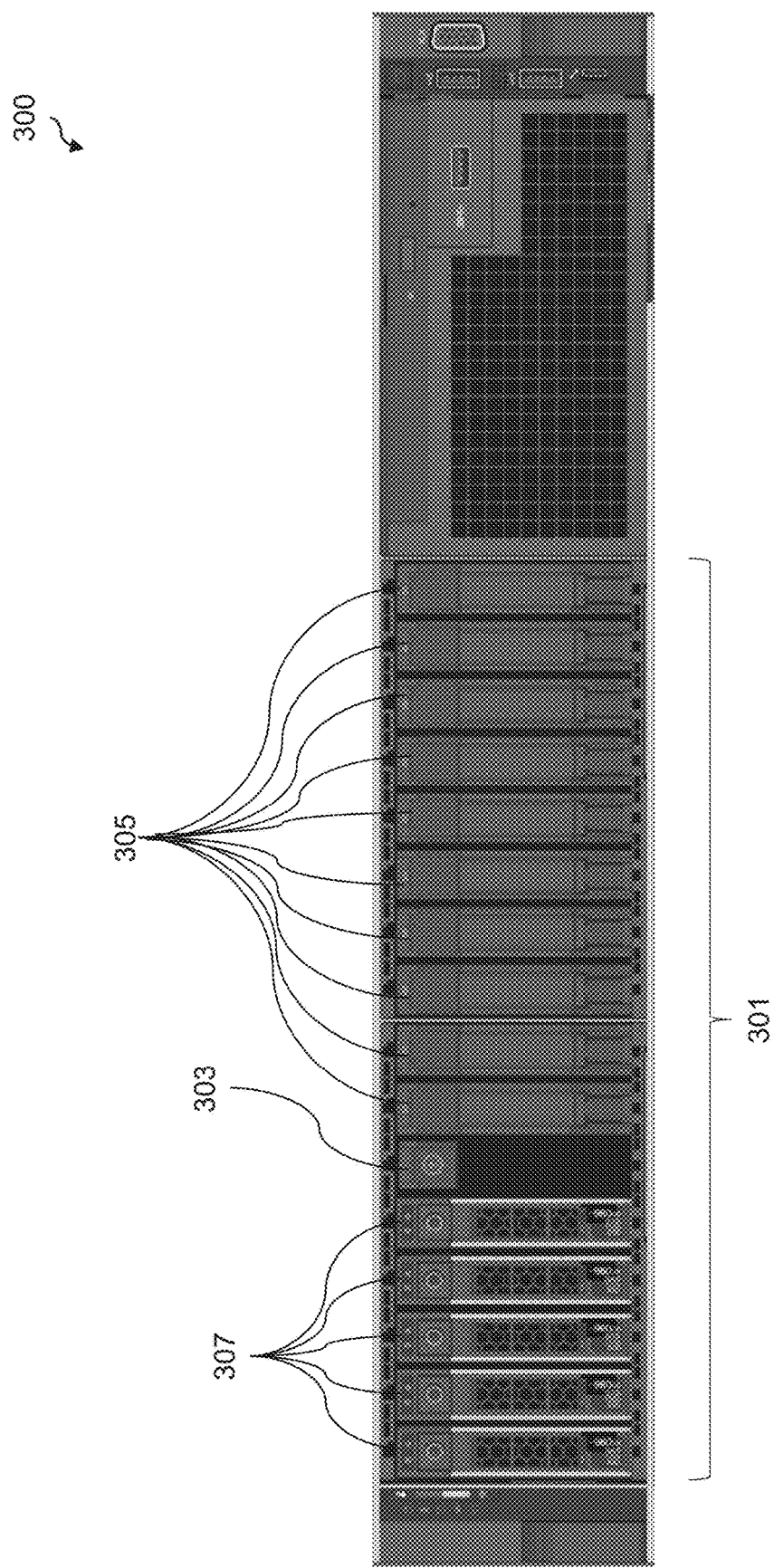
FIG. 3A shows a storage system with a drive enclosure comprising drive bays configured to indicate status information in an illustrative embodiment.
Figure 3D:
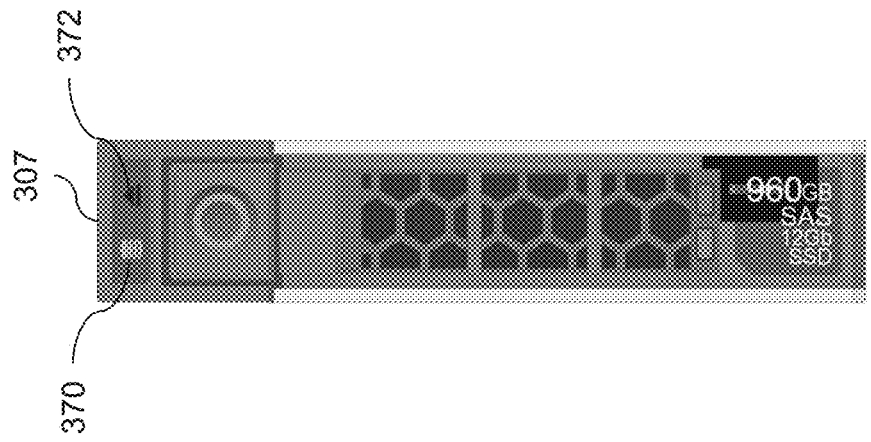
FIG. 3D shows a drive tray for a drive bay in an illustrative embodiment.
Figure 3C:
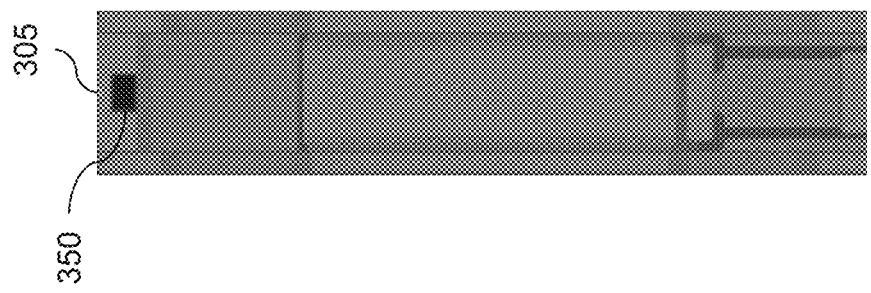
FIG. 3C shows a filler plate for a drive bay in an illustrative embodiment.
Figure 3B:
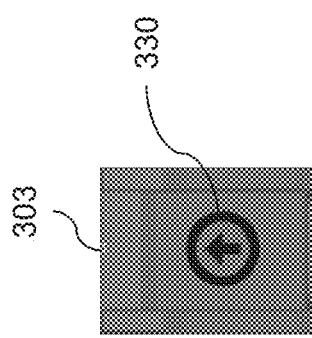
FIG. 3B shows a turnover plate for a drive bay in an illustrative embodiment.

FIG. 3A shows an example transformable drive-indicating storage system 300, which includes a drive bay enclosure 301 with a set of hot-swappable drive bays. In the FIG. 3A example, there is one turnover plate 303 shown, as well as ten filler plates 305 and five drive tray plates 307. The first five drive bays have drive tray plates 307 mounted therein (and thus the turnover plates 303 for such drive bays are in the folded state shown in FIG. 4B, described below). The sixth drive bay has its turnover plate 303 in the unfolded state. The remaining ten drive bays have filler plates 305 mounted therein (and thus the turnover plates 303 for such drive bays are in the folded state shown in FIG. 4B, described below). FIG. 3B shows a close-up view of the turnover plate 303, which includes a center indicator 330. FIG. 3C shows a close-up view of one of the filler plates 305, which includes a top center indicator 350. FIG. 3D shows a close-up view of one of the drive tray plates 307, which includes a top left indicator 370 and a top right indicator 372. The hot-swappable drive bays of the drive bay enclosure 301 of the transformable drive-indicating storage system 300 may thus operate in three working modes—a turnover plate 303 operating mode, a filler plate 305 operating mode, and drive tray plate 307 operating mode.

In the turnover plate 303 operating mode, a first indicator pattern is used to represent that an associated hot-swappable drive bay is ready for adding a drive and a second indicator pattern is used to represent that the associated hot-swappable drive bay is not ready for adding a drive. The first indicator pattern may be, for example, the center indicator 330 light blinking blue or some other designated color, while the second indicator pattern may include the center indicator 330 light being off, a steady light, a blinking light of a different color than that used in the first indicator pattern, etc.

In the filler plate 305 operating mode, a first indicator pattern is used to represent that an associated hot-swappable drive bay is ready for adding a drive, and a second indicator pattern is used to represent that the associated hot-swappable drive bay is not ready for adding a drive. The first and second indicator patterns in the filler plate 305 operating mode may be similar to the first and second indicator patterns used in the turnover plate 303 operating mode, though the indicator 350 is used rather than the center indicator 330. As noted above, the indicator 350 may be a passive illuminant that reflects light from an LED on a luminous spindle.

For the drive tray plate 307 operating mode, a first indicator pattern is used to represent that a drive in the associated hot-swappable drive bay is configured, a second indicator pattern is used to represent that the drive in the associated hot-swappable drive bay is performing some designated operation (e.g., rebuilding data, performing a data migration, etc.), a third indicator pattern is used to represent that a data error has occurred on the drive in the associated hot-swappable drive bay, a fourth indicator pattern is used to represent that the installed drive in the associated hot-swappable drive bay is not "eligible" or otherwise does not match the specification of storage system requirements (e.g., for use in a designated SDS storage pool or some other application), a fifth indicator pattern is used to represent that the drive in the associated hot-swappable drive bay is ready for removal, and a sixth indicator pattern is used to represent that the associated hot-swappable drive bay is ready for replacing the current drive mounted therein. As mentioned above, the fourth indicator pattern may be used to represent that the installed drive in a given hot-swappable drive bay is not eligible, which is a concept utilized by various vendors (e.g., VMWare® vSAN, Microsoft® Storage Spaces Direct (S2D), NetApp®, etc.) to indicate that an installed drive does not match storage system requirements of an associated SDS storage pool or other application.

The first through sixth indicator patterns for the drive tray plate 307 operating mode may utilize various different combination of lighting the top left indicator 370 and the top right indicator 372. For example, the first indicator pattern may include lighting the top left indicator 370 solid white or some other designated color, while keeping the top right indicator 372 off. The second indicator pattern may include blinking the top left indicator 370 white or some other designated color, while again keeping the top right indicator 372 off. The third indicator pattern may include lighting the top left indicator 370 solid amber, or some other designated color different than the color used in the first indicator pattern, while the top right indicator 372 is kept off. The fourth indicator pattern may include blinking the top left indicator 370 light amber, or some other color different than that used in the second indicator pattern, while simultaneously blinking the top right indicator 372 red or some other designated color. The fifth indicator pattern may include blinking the top right indicator 372 red or some other designated color, while keeping the top left indicator 370 off. The sixth indicator pattern may include alternating blinking of the top left indicator 370 and the top right indicator 372, where the top left indicator 370 is blinking amber or some other designated color while the top right indicator 372 blinks red or some other designated color.

It should be noted that the above-described indicator patterns used for the turnover plate 303 operating mode, the filler plate 305 operating mode, and the drive tray plate 307 operating mode are presented by way of example only. Various other types of indicator patterns (e.g., blinking lights, steady lights, off lights, alternating blinking lights or colors, etc.) may be used as desired to represent different statuses of hot-swappable drive bays in a transformable drive-indicating storage system. Further, embodiments are not limited solely to indicating the statuses described above. Various additional drive bay statuses may be indicated through additional indicator patterns using indicator lights on the turnover plate 303, filler plate 305 and drive tray plate 307.

Figure 4A:
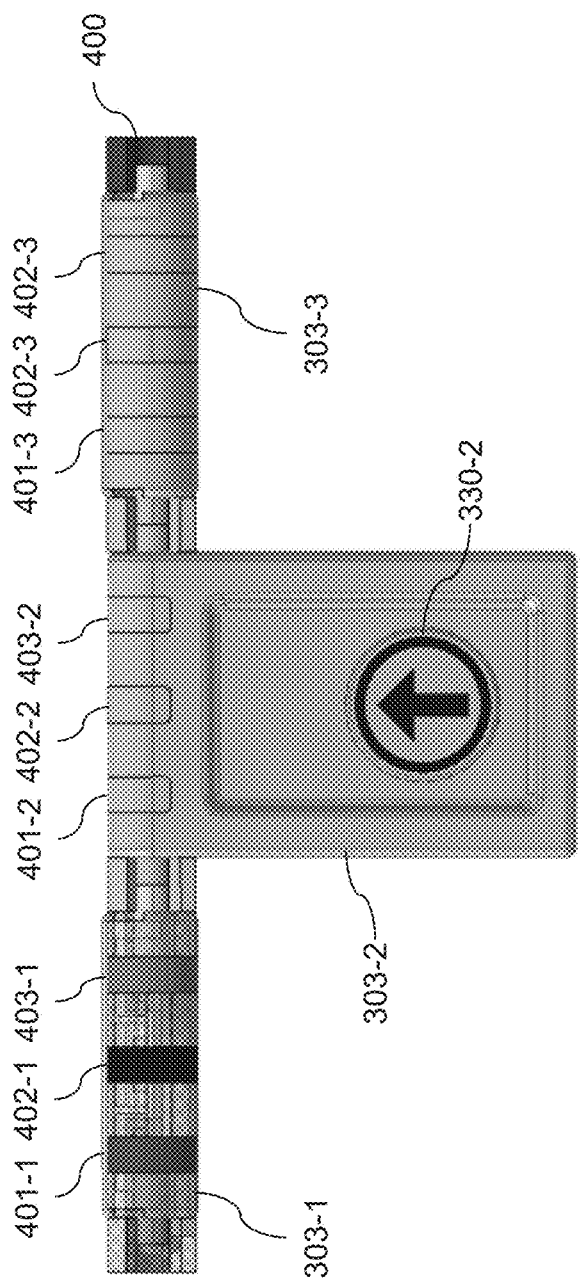
FIG. 4A show a luminous spindle and lights for turnover plates of drive bays in an illustrative embodiment.

FIG. 4A shows detail of a luminous spindle 400, on which turnover plates 303-1, 303-2 and 303-3 (collectively, turnover plates 303) are mounted. FIG. 4A more particularly shows the turnover plate 303-2 in the center drive bay slot in the unfolded state, while the turnover plates 303-1 and 303-2 in the left and right drive bay slots are in the folded state. The luminous spindle 400 includes sets of luminous rings that are used to generate indicator patterns displayed on the turnover plates 303 (or on filler plates 305 or drive tray plates 307 when installed). In the FIG. 4A example, three sets of luminous rings are shown for three hot-swappable drive bay slots. Each set of luminous rings includes three lights (e.g., LEDs). Each of the sets of luminous rings includes a first light (401-1, 401-2 and 401-3, collectively 401), a second light (402-1, 402-2 and 402-3, collectively 402), and a third light (403-1, 403-2 and 403-3, collectively 403). The lights 401 are used to control what is displayed in the top left indicators 370 of the drive tray plates 307, the lights 402 are used to control what is displayed in the center indicators 330 of the turnover plates 303 and the indicators 350 of the filler plates 305, and the lights 403 are used to control what is displayed in the top right indicators 372 of the drive tray plates 307.

Figure 4C:
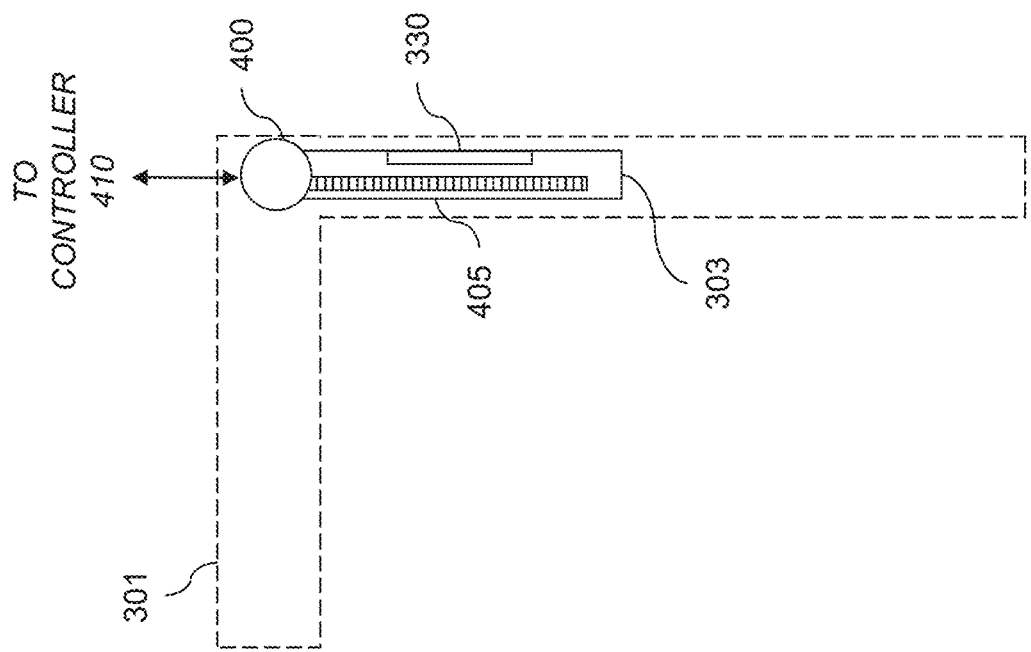
FIG. 4C shows a turnover plate in an unfolded state in an illustrative embodiment.
Figure 4B:
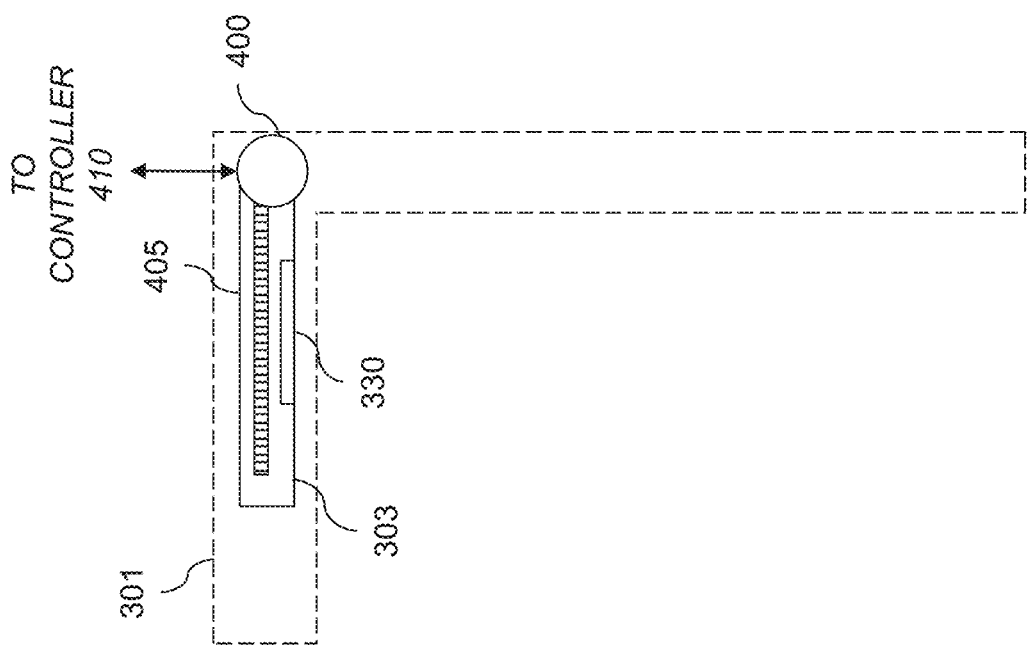
FIG. 4B shows a turnover plate in a folded state in an illustrative embodiment.

FIGS. 4B and 4C illustrate the turnover plate 303 in folded and unfolded states. FIG. 4B, for example, shows the turnover plate 303 folded up within the drive bay enclosure 301. FIG. 4B also shows a circuit board 405 that is housed within the turnover plate 303, and may be used for control of sets of lights of the luminous spindle 400 (e.g., for controlling the sets of lights 401, 402 and 403). The circuit board 405 is illustratively connected, via the luminous spindle 400 to a controller 410 (e.g., a BMC or other storage controller of a storage system such as one or more of the storage controllers 110 of the storage array 106-1 in system 100). The turnover plate 303 for a particular hot-swappable drive bay in some embodiments is in the folded state or position of FIG. 4B when a filler plate 305 is mounted to that hot-swappable drive bay, or when a drive and associated drive tray plate 307 is mounted to that hot-swappable drive bay. FIG. 4C shows the turnover plate 303 unfolded, with the center indicator 330 facing outwards from the drive enclosure 301.

FIG. 5 shows a perspective view of a portion of a drive bay enclosure (e.g., 301), including a drive tray plate 307 mounted in a first drive bay which has its associated turnover plate 303-1 in the folded state, a turnover plate 303-2 in the unfolded state in a second drive bay, and a filler plate 305 in a third drive bay which also has its associated turnover plate 303-3 in the folded state. The first and third drive bays have their turnover plates 303-1 and 303-2 in the folded position. The turnover plate 303-1 for the first drive bay is shown partially transparent, illustrating the circuit board 405 housed therein. Sets of lights 401, 402 and 403 are shown on a luminous spindle 400 for the first, second and third drive bays. In illustrative embodiments, the luminous spindle 400 may thus be embedded into the chassis frame of the drive bay enclosure 301. Light sources are passed from the luminous spindle 400 to the indicators 370 and 372 of the drive tray plates 307 (e.g., through two short light pipes on the top of the drive tray).

Figure 6:
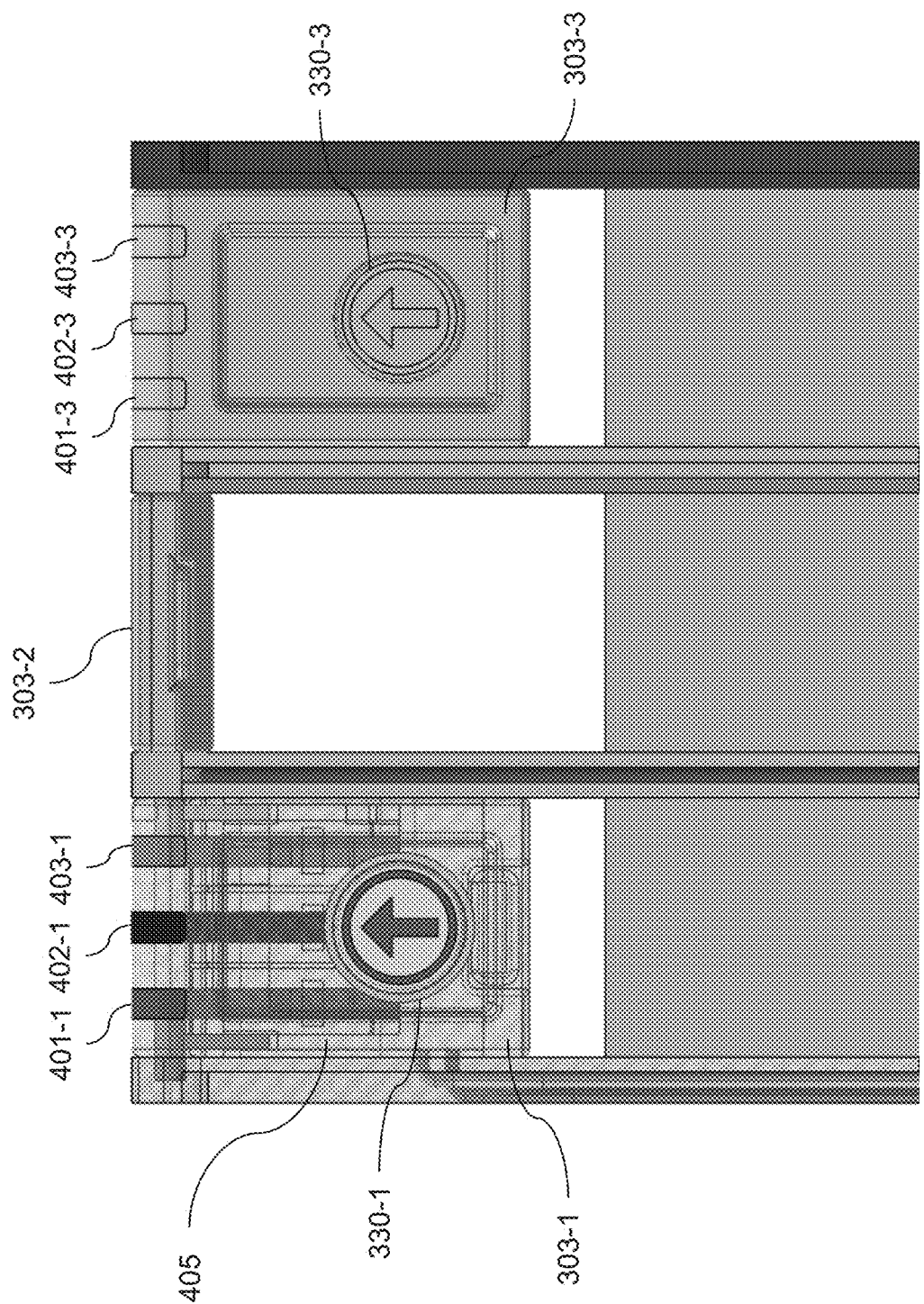
FIG. 6 shows a front view of a drive enclosure with turnover plates installed in drive bays thereof in an illustrative embodiment.

FIG. 6 shows a front view of part of a drive enclosure (e.g., 301) with three drive bays and associated turnover plates 303-1, 303-2 and 303-2 (collectively, turnover plates 303). First and second turnover plates 303-1 and 303-3 with associated center indicators 330-1 and 330-3 in the left and right drive bays are in the unfolded state or position, while the turnover plate 303-2 in the center drive bay is in the folded position. As shown, the turnover plate 303-1 is mounted to a luminous spindle (e.g., 400) and has lights 401-1, 402-1 and 403-1. The turnover plate 303-3 is also mounted to the luminous spindle and has lights 401-3, 402-3 and 403-3. Lights for the turnover plate 303-2 in the folded state of the center drive bay are not shown for clarity of illustration. The turnover plate 303-1 is also shown partially transparent, illustrating the circuit board 405 contained therein which is coupled to the lights 401-1, 402-1 and 403-1.

An example drive replacement workflow for hot-swapping a drive in a drive bay of the drive enclosure 301 of the transformable drive-indicating storage system 300 will now be described with respect to FIGS. 7-14.

Figure 7:
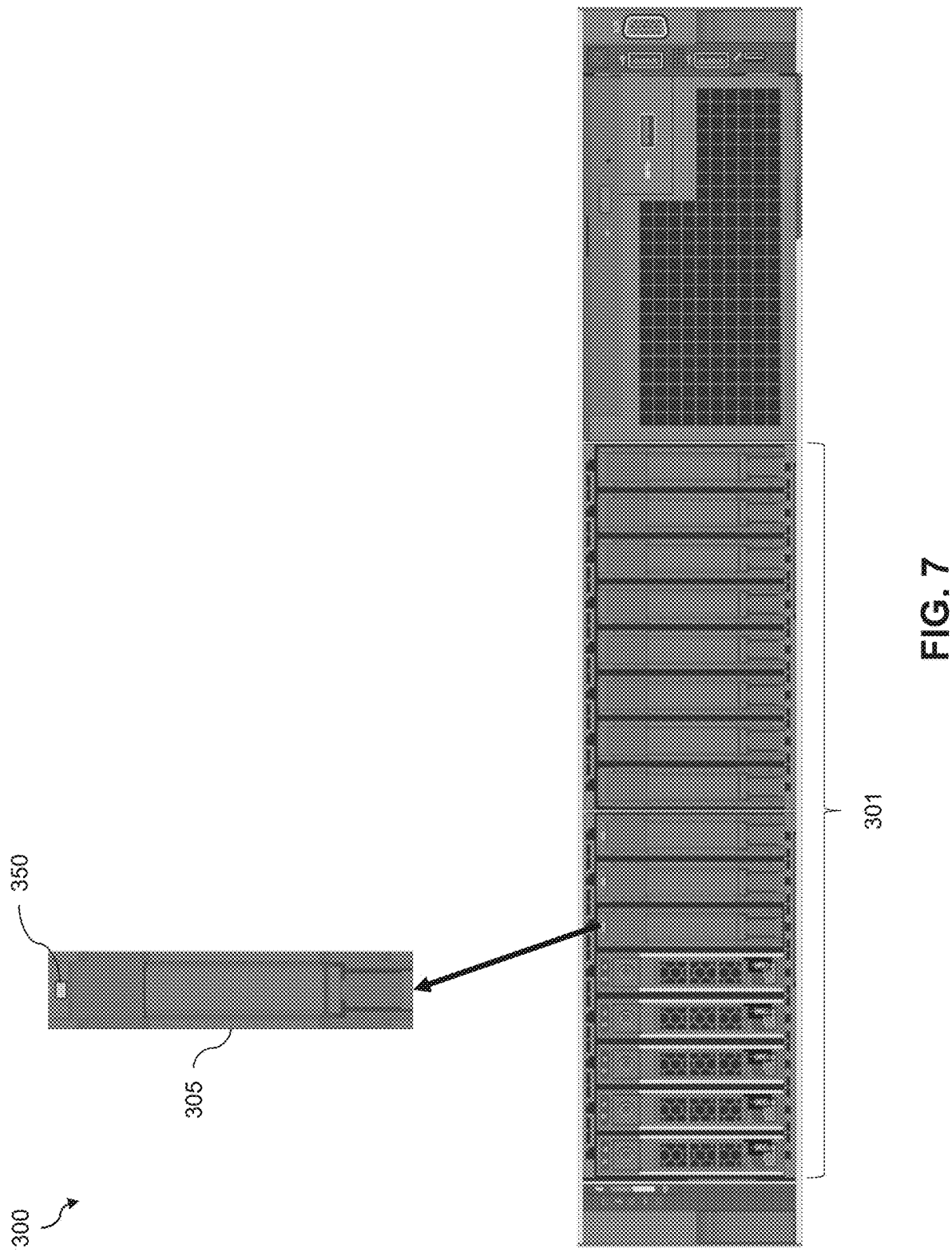
FIG. 7 shows a drive bay of a drive enclosure with an indicator light of a filler plate unlit in an illustrative embodiment.

FIG. 7 shows the transformable drive-indicating storage system 300, and a drive bay of interest which currently has installed therein a filler plate 305 with its indicator 350 light off (e.g., not in a ready for adding a drive state).

Figure 8:
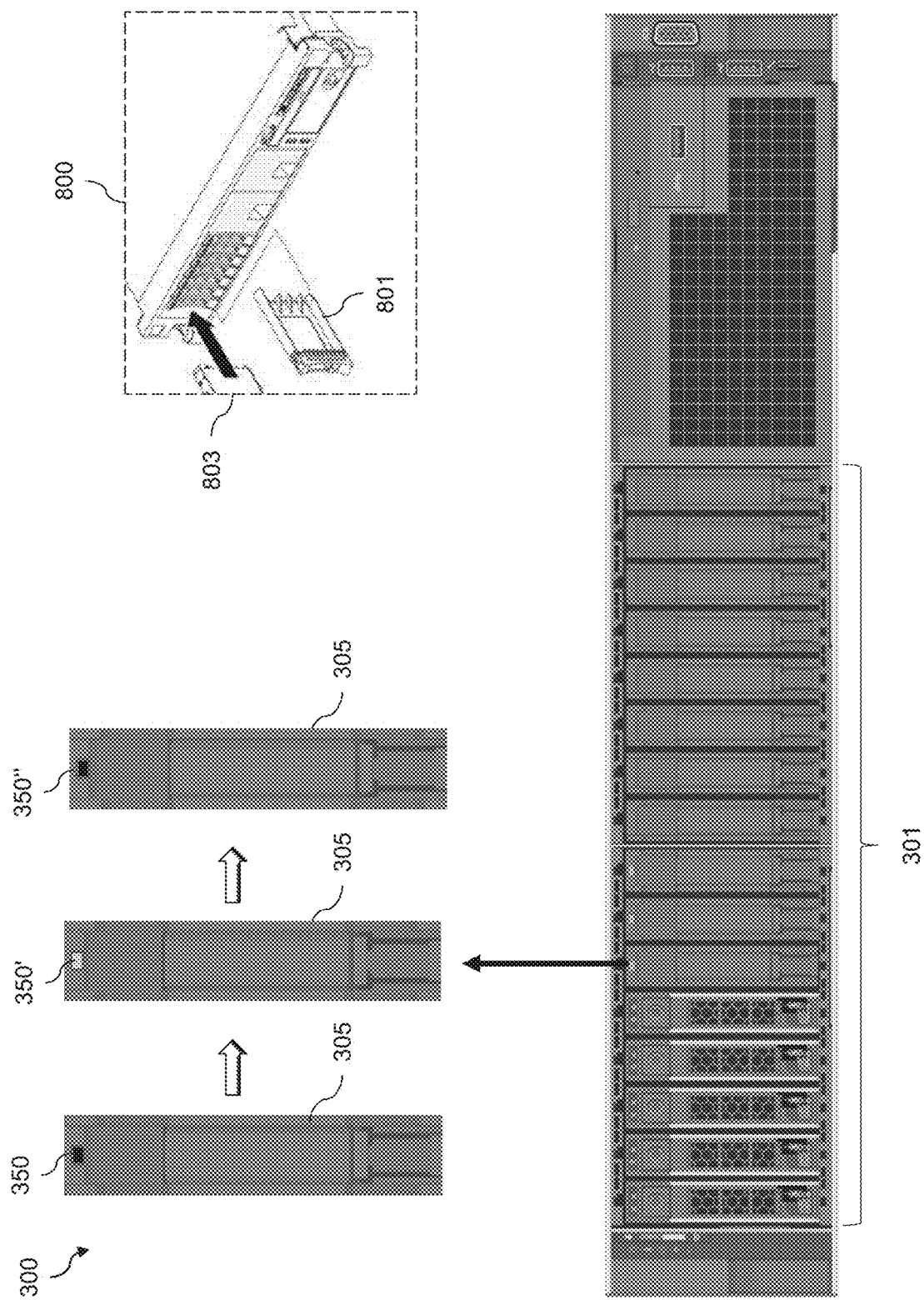
FIG. 8 shows a drive bay of a drive enclosure with an indicator light of a filler plate blinking in an illustrative embodiment.

FIG. 8 shows the filler plate 305 with its indicator 350 light blinking (e.g., lit 350, off 350', lit 350", etc.) indicating that the associated drive bay is ready for adding a drive. FIG. 8 also shows a view 800, illustrating removal 801 of the filler plate 305 and insertion 903 of a drive into the drive bay.

Figure 9:
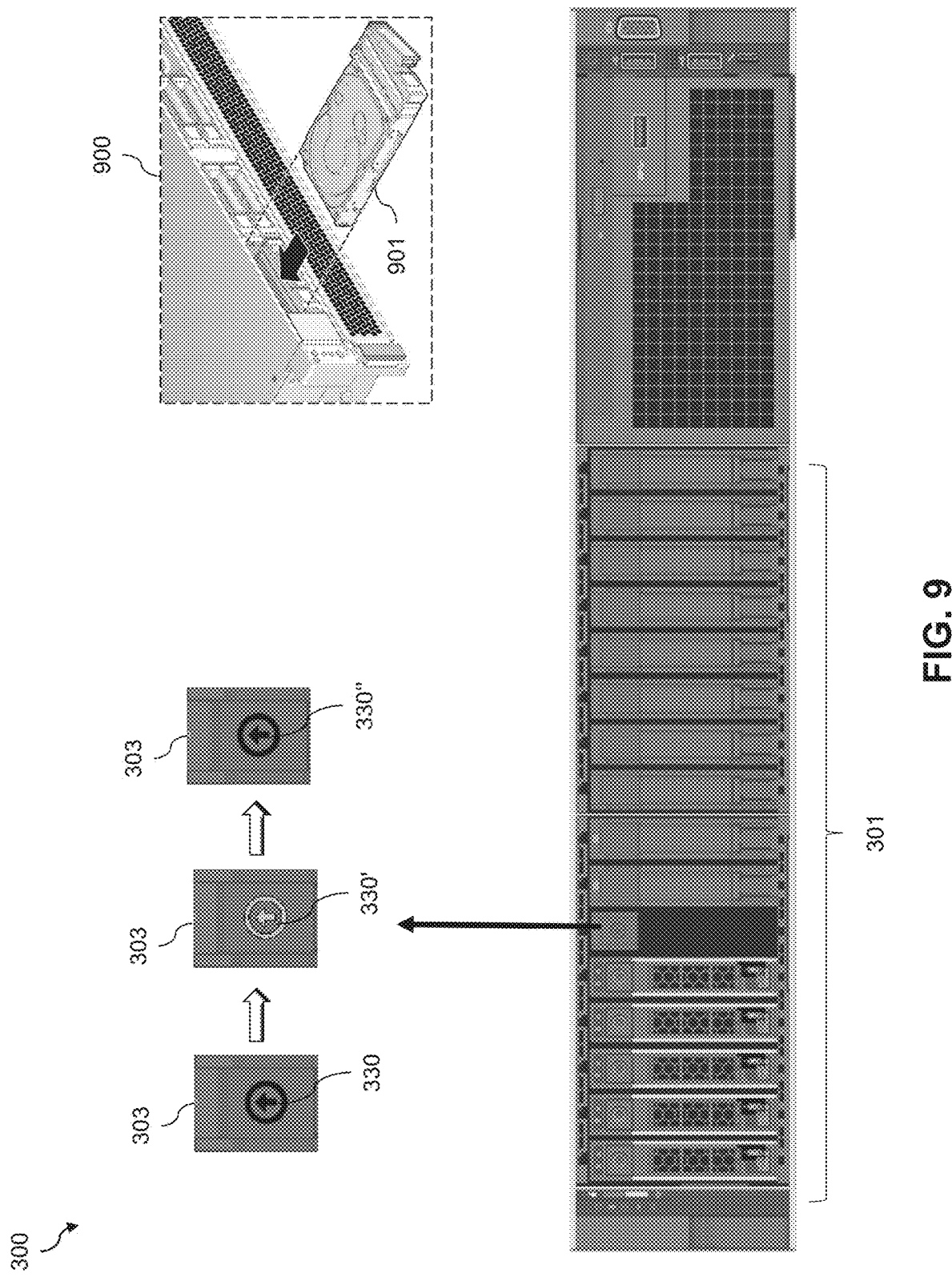
FIG. 9 shows a drive bay of a drive enclosure with an indicator light of a turnover plate blinking in an illustrative embodiment.

FIG. 9 shows a ready for adding state that is indicated using turnover plate 303, rather than filler plate 305. The turnover plate 303 has its center indicator 330 light blinking (e.g., lit 330, off 330', lit 330", etc.) indicating that the associated drive bay is ready for adding a drive. FIG. 9 also shows a view 900, illustrating insertion 901 of a drive into the drive bay (where insertion 901 of the drive will cause the turnover plate 303 to enter the folded state).

Figure 10:
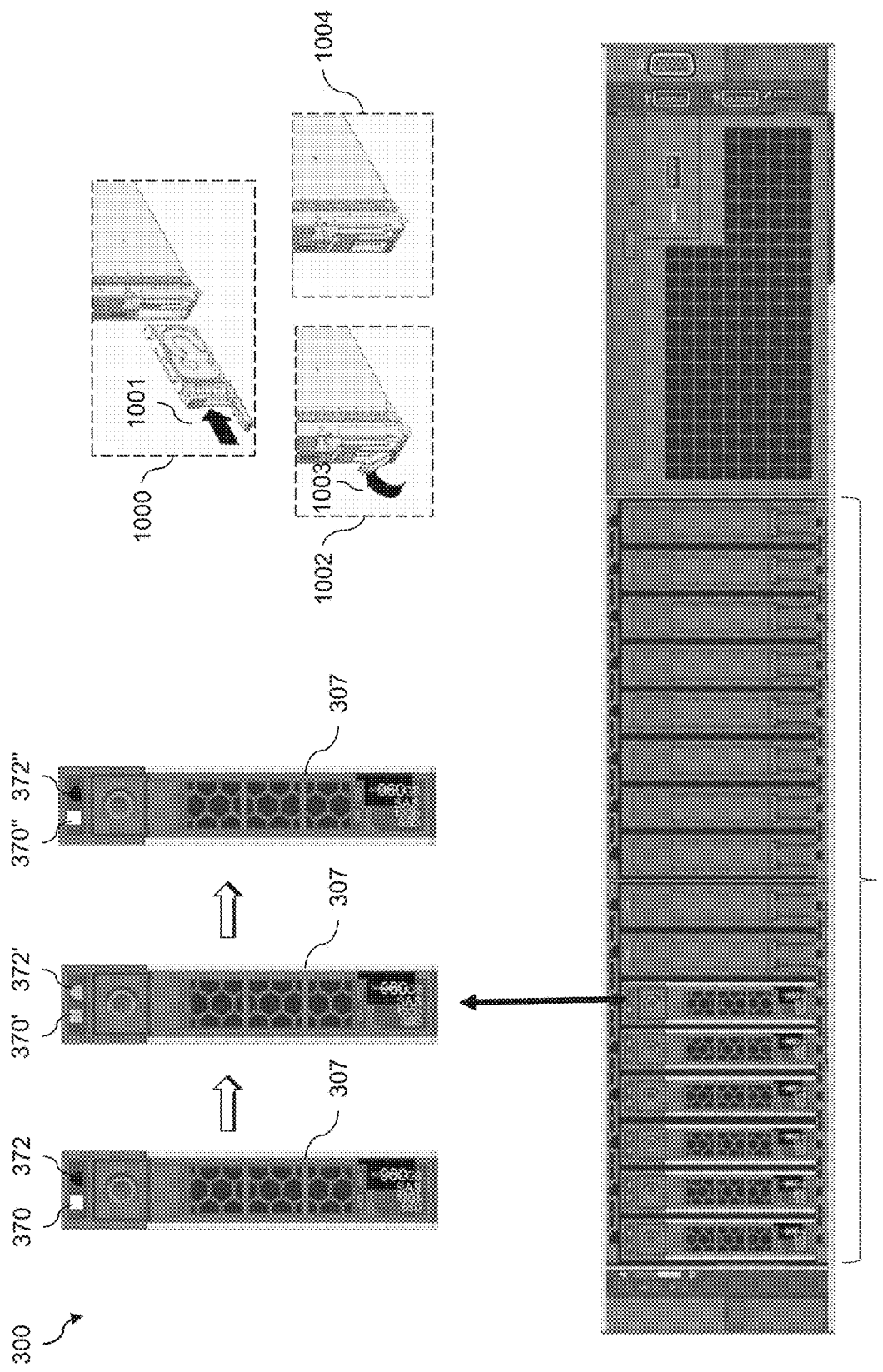
FIG. 10 shows a drive bay of a drive enclosure with first and second indicator lights of a drive tray blinking simultaneously in an illustrative embodiment.

FIG. 10 shows a drive tray plate 307 indicating that a drive is ineligible (e.g., where the drive mounted in the drive bay does not meet storage requirements, such as requirements for a SDS storage pool). More particularly, the drive tray plate 307 has its top left indicator 370 and top right indicator 372 lights blinking simultaneously with one another (e.g., lit 370, 372, off 370', 372', lit 370", 372"). FIG. 10 also shows views 1000, 1002 and 1004 illustrating removal 1001 of the mismatched drive and insertion 1003 of a new drive.

Figure 11:
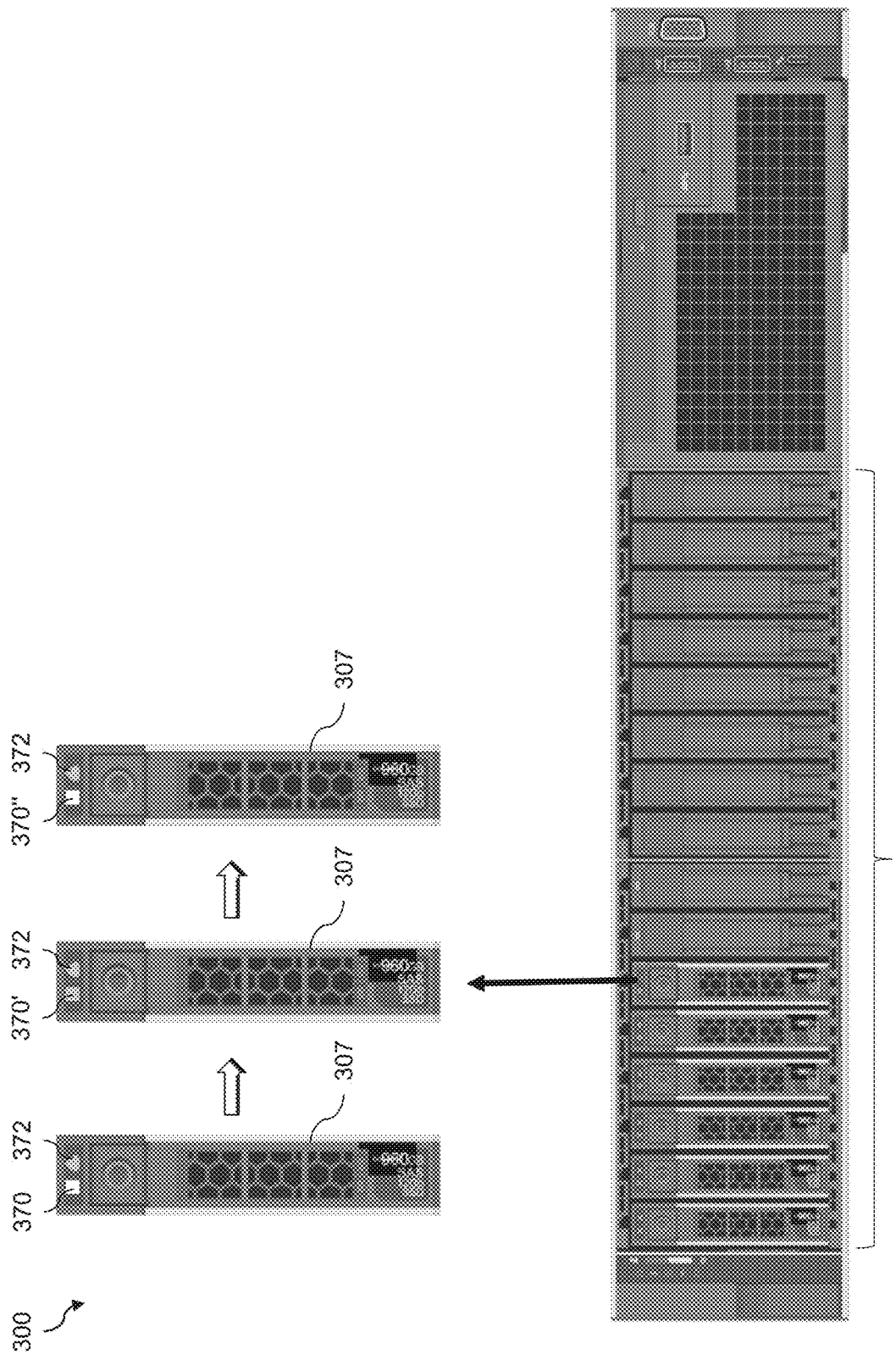
FIG. 11 shows a drive bay of a drive enclosure with a first indicator light of a drive tray blinking and a second indicator light of the drive tray unlit in an illustrative embodiment.

FIG. 11 shows a drive tray plate 307 indicating that the drive mounted therein is rebuilding data, performing data migration, or is otherwise subject to some application operation (e.g., for a SDS storage pool). More particularly, the drive tray 307 has its top left indicator 370 light blinking (e.g., lit 370, off 370', lit 370") while the top right indicator 372 light remains off.

Figure 12:
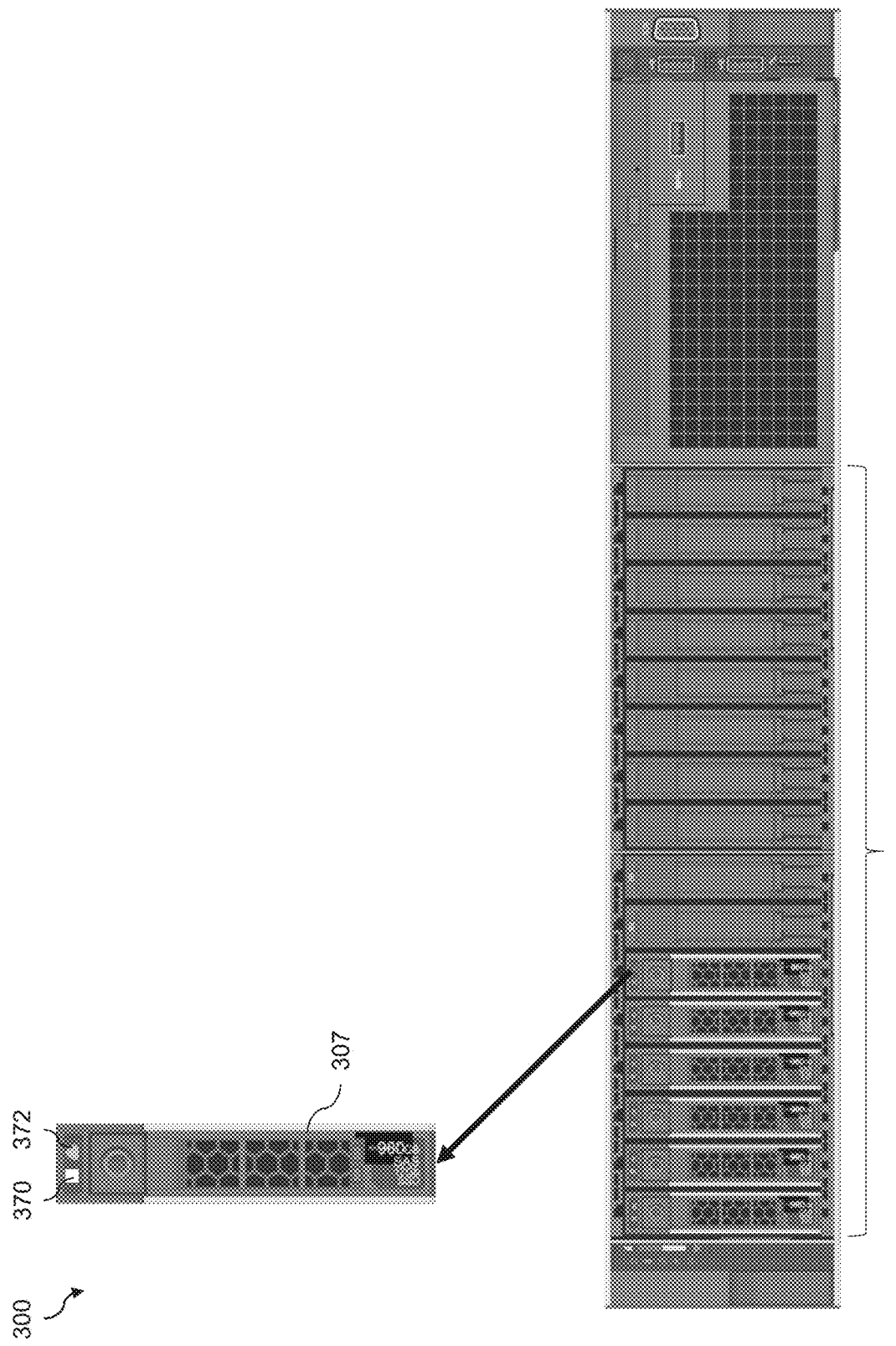
FIG. 12 shows a drive bay of a drive enclosure with a first indicator light of a drive tray lit and a second indicator light of the drive tray unlit in an illustrative embodiment.

FIG. 12 shows the drive tray plate 307 with its top left indicator 370 light steady on and its top right indicator 372 light steady off. Depending on the color of the left indicator 370 light, this may represent different drive statuses. For example, if the left indicator 370 light is steady white, this may represent that the drive mounted therein is a member of a SDS storage pool. If the left indicator 370 light is steady amber, this may indicate a data error or software failure for the drive mounted therein.

Figure 13:
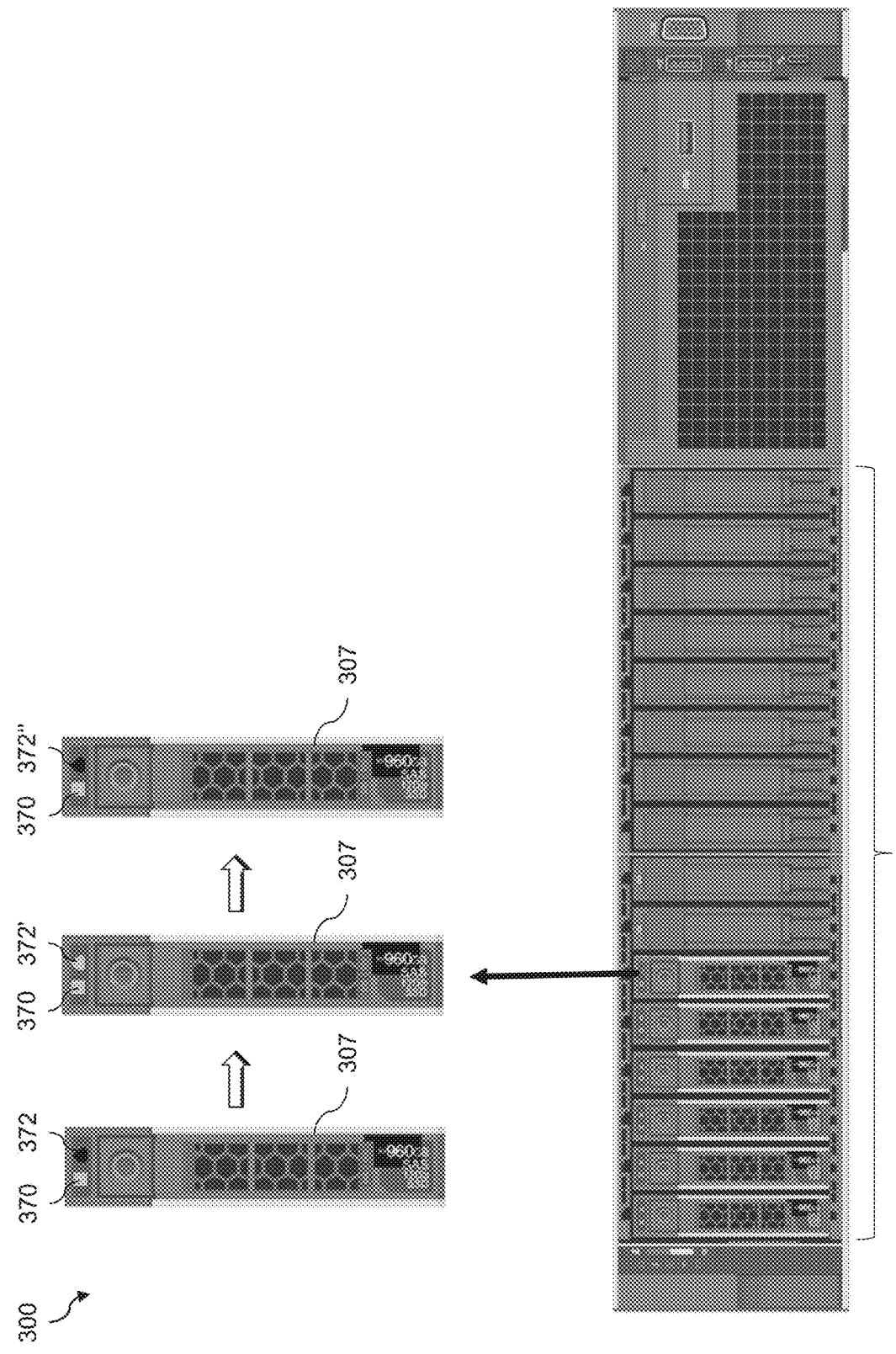
FIG. 13 shows a drive bay of a drive enclosure with a first indicator light of a drive tray unlit and a second indicator light of the drive tray blinking in an illustrative embodiment.

FIG. 13 shows the drive tray plate 307 indicating that the drive mounted therein is ready for removal from the drive bay. More particularly, the drive tray plate 307 has its top right indicator 372 light blinking (e.g., lit 372, off 372', lit 372") while the top left indicator 370 light remains off.

Figure 14:
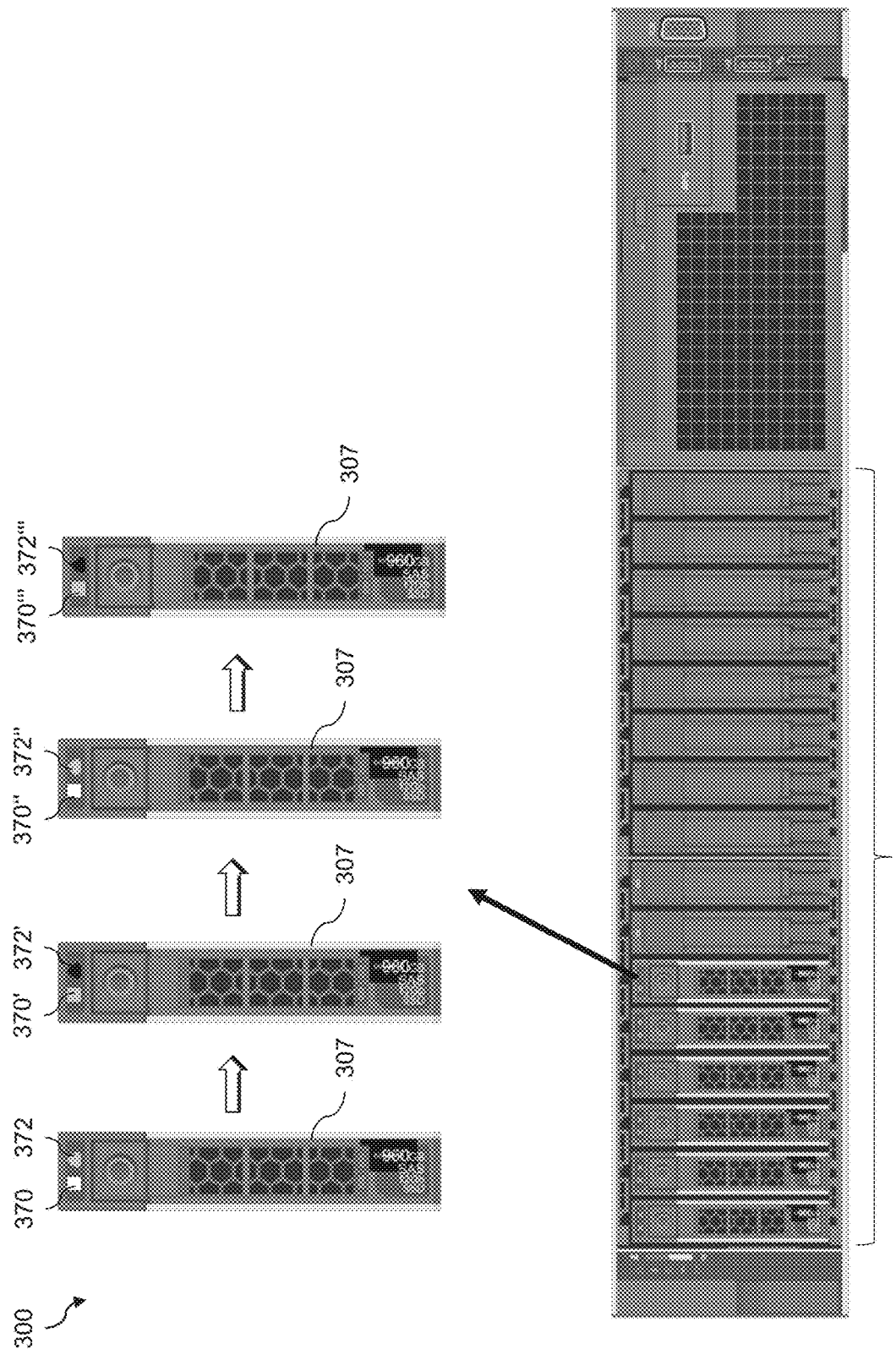
FIG. 14 shows a drive bay of a drive enclosure with first and second indicator light of a drive tray blinking in turn in an illustrative embodiment.

FIG. 14 shows the drive tray plate 307 indicating that the drive mounted therein is ready for replacement. More particularly, the drive tray plate 307 has its top light indicator 370 and top right indicator 372 lights blinking in turn (e.g., 370 on and 372 off, 370' off and 372' on, 370" on and 372" off, 370''' off and 372''' on, etc.).

Using the turnover plates 303, filler plates 305 and drive tray plates 307, a transformable drive-indicating storage system 300 can indicate status information for both mounted and vacant drive bays in a drive enclosure 301. The embedded and foldable mechanism of the turnover plate 303 advantageously does not require extra panel room. Further, the luminous spindle 400 (and associated lights 401, 402 and 403) provide passive illuminants on the front of the filler plates 305 and drive tray plates 307, and also potentially the turnover plates 303, thus not requiring electronic connections. The transformable drive-indicating storage system 300 may be used to help IT administrators and other users operate drive bays more easily, avoiding maloperation. Further, indicator patterns may be used to provide full-feature SDS status information with a high-density storage design. Further, even vacant drive bays (with or without filler plates 305) can show status information or operation tips using the turnover plates 303. The indicators used in the transformable drive-indicating storage system 300 are also advantageously programmable, and may thus be tailored to the needs of specific use cases and controlled by various storage management software. The transformable drive-indicating storage system 300 may comprise any type of device that includes one or more hot-swappable drive bays, including but not limited to general-purpose servers, storage devices, storage chassis, etc.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement functionality for controlling status indicators for drive bays of a drive bay enclosure of a storage system will now be described in greater detail with reference to FIGS. 15 and 16. Although described in the context of system 100, these platforms may also be used to implement at least portions of other information processing systems in other embodiments.

Figure 15:
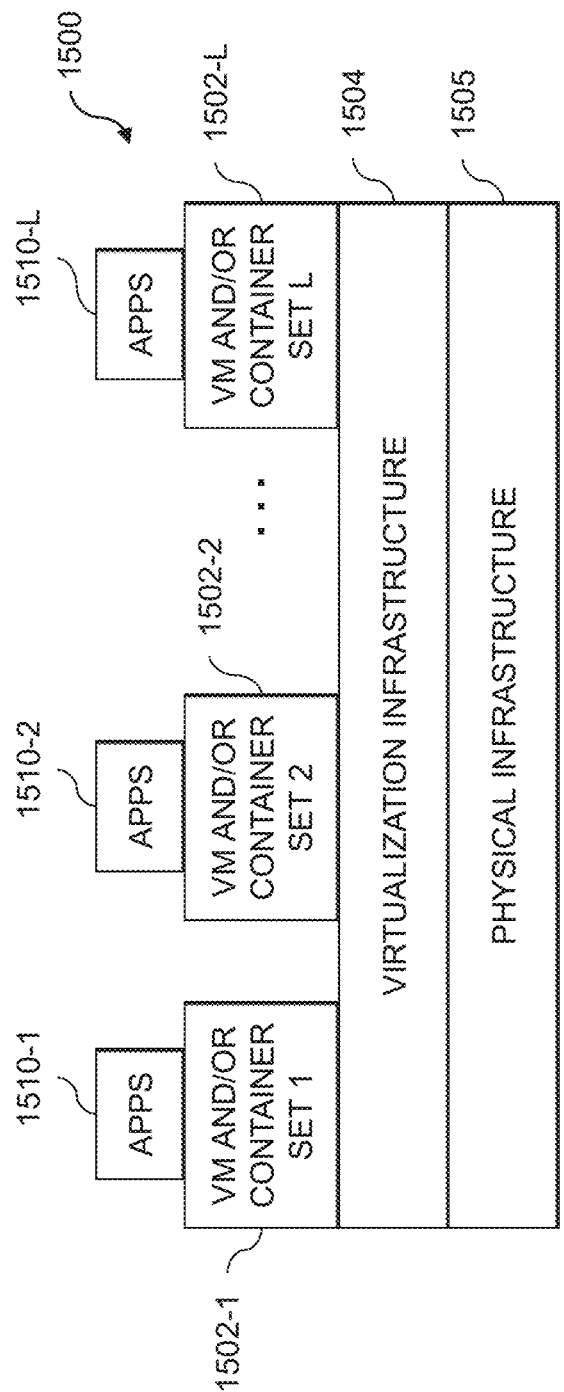
FIGS. 15 and 16 show examples of processing platforms that may be utilized to implement at least a portion of an information processing system in illustrative embodiments.
Figure 16:
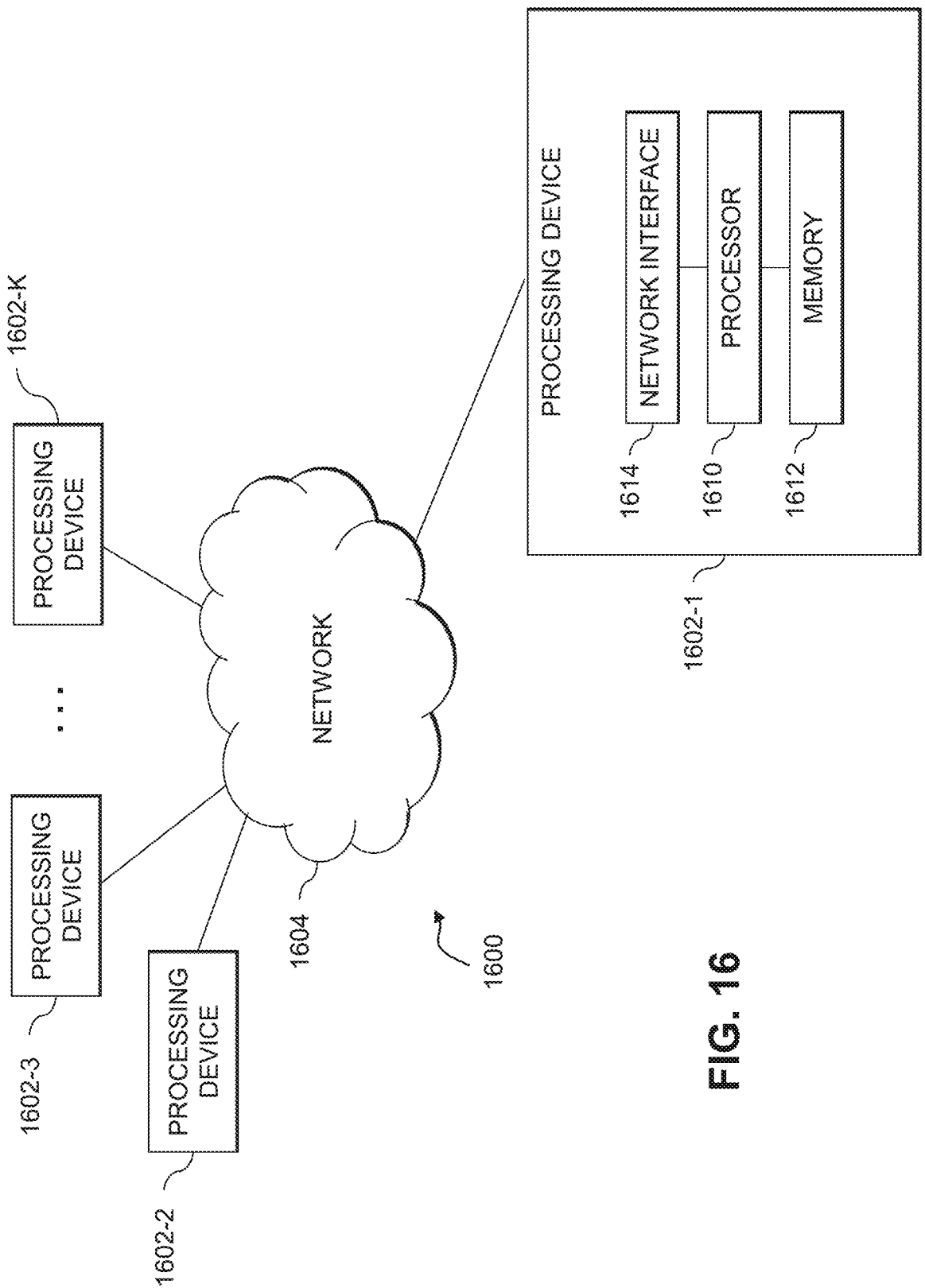

FIG. 15 shows an example processing platform comprising cloud infrastructure 1500. The cloud infrastructure 1500 comprises a combination of physical and virtual processing resources that may be utilized to implement at least a portion of the information processing system 100 in FIG. 1. The cloud infrastructure 1500 comprises multiple virtual machines (VMs) and/or container sets 1502-1, 1502-2, . . . 1502-L implemented using virtualization infrastructure 1504. The virtualization infrastructure 1504 runs on physical infrastructure 1505, and illustratively comprises one or more hypervisors and/or operating system level virtualization infrastructure. The operating system level virtualization infrastructure illustratively comprises kernel control groups of a Linux operating system or other type of operating system.

The cloud infrastructure 1500 further comprises sets of applications 1510-1, 1510-2, . . . 1510-L running on respective ones of the VMs/container sets 1502-1, 1502-2, . . . 1502-L under the control of the virtualization infrastructure 1504. The VMs/container sets 1502 may comprise respective VMs, respective sets of one or more containers, or respective sets of one or more containers running in VMs.

In some implementations of the FIG. 15 embodiment, the VMs/container sets 1502 comprise respective VMs implemented using virtualization infrastructure 1504 that comprises at least one hypervisor. A hypervisor platform may be used to implement a hypervisor within the virtualization infrastructure 1504, where the hypervisor platform has an associated virtual infrastructure management system. The underlying physical machines may comprise one or more distributed processing platforms that include one or more storage systems.

In other implementations of the FIG. 15 embodiment, the VMs/container sets 1502 comprise respective containers implemented using virtualization infrastructure 1504 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element may be viewed as an example of what is more generally referred to herein as a "processing device." The cloud infrastructure 1500 shown in FIG. 15 may represent at least a portion of one processing platform. Another example of such a processing platform is processing platform 1600 shown in FIG. 16.

The processing platform 1600 in this embodiment comprises a portion of system 100 and includes a plurality of processing devices, denoted 1602-1, 1602-2, 1602-3, . . . 1602-K, which communicate with one another over a network 1604.

The network 1604 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 1602-1 in the processing platform 1600 comprises a processor 1610 coupled to a memory 1612.

The processor 1610 may comprise a microprocessor, a microcontroller, an application-specific integrated circuit (ASIC), a field-programmable gate array (FPGA), a central processing unit (CPU), a graphical processing unit (GPU), a tensor processing unit (TPU), a video processing unit (VPU) or other type of processing circuitry, as well as portions or combinations of such circuitry elements.

The memory 1612 may comprise random access memory (RAM), read-only memory (ROM), flash memory or other types of memory, in any combination. The memory 1612 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1602-1 is network interface circuitry 1614, which is used to interface the processing device with the network 1604 and other system components, and may comprise conventional transceivers.

The other processing devices 1602 of the processing platform 1600 are assumed to be configured in a manner similar to that shown for processing device 1602-1 in the figure.

Again, the particular processing platform 1600 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for controlling status indicators for drive bays of a drive bay enclosure of a storage system as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, storage systems, status indicators, drive bay plates, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
at least one processing device comprising a processor coupled to a memory; and
a drive bay enclosure of a storage system comprising a housing with one or more drive bays;
a spindle comprising one or more lights;
the housing of the drive bay enclosure comprising one or more status indicators proximate an opening for at least a given one of the one or more drive bays;
a plate configurable to cover at least a portion of the opening for the given drive bay, the plate comprising at least one of the one or more status indicators; and
the at least one processing device being configured to perform steps of:
determining status information for the given drive bay; and
controlling the one or more status indicators proximate the opening for the given drive bay based at least in part on the determined status information, wherein controlling the one or more status indicators comprises selectively activating respective ones of the one or more lights of the spindle to passively illuminate at least a portion of the plate.

2. The apparatus of claim 1 wherein at least one of the one or more status indicators is at least one of: mounted on the housing of the drive bay enclosure; and formed integrally with the housing of the drive bay enclosure.

3. The apparatus of claim 1 wherein the plate comprises a turnover plate rotatably mounted to the spindle proximate the opening for the given drive bay.

4. The apparatus of claim 3 wherein the turnover plate is configured:
to be rotated into a folded state when at least one of a filler plate and a drive tray plate is installed in the opening for the given drive bay; and
to be rotated into an unfolded state covering at least a portion of the opening for the given drive bay when the filler plate and the drive tray plate are not installed in the opening for the given drive bay.

5. The apparatus of claim 3 wherein the turnover plate comprises a control circuit board configured for coupling to at least one of the one or more lights of the spindle.

6. The apparatus of claim 1 wherein the plate comprises a filler plate installed in the opening for the given drive bay.

7. The apparatus of claim 1 wherein the plate comprises a drive tray plate installed in the opening for the given drive bay.

8. The apparatus of claim 1 wherein determining status information for the given drive bay comprises determining whether the given drive bay is ready for adding a storage device, and wherein controlling the one or more status indicators comprises selectively illuminating at least one indicator on the plate responsive to determining that the given drive bay is ready for adding the storage device.

9. The apparatus of claim 1 wherein determining status information for the given drive bay comprises determining whether a storage device installed in the given drive bay is a member of a software-defined storage pool, and wherein controlling the one or more status indicators comprises selectively illuminating at least one indicator on the plate responsive to determining that the storage device installed in the given drive bay is a member of software-defined storage pool.

10. The apparatus of claim 1 wherein determining status information for the given drive bay comprises determining whether a storage device installed in the given drive bay is performing one or more operations associated with a software-defined storage pool, and wherein controlling the one or more status indicators comprises selectively illuminating at least one indicator on the plate responsive to determining that the storage device installed in the given drive bay is performing the one or more operations associated with the software-defined storage pool.

11. The apparatus of claim 1 wherein determining status information for the given drive bay comprises determining whether a data error has occurred for a storage device installed in the given drive bay, and wherein controlling the one or more status indicators comprises selectively illuminating at least one indicator on the plate responsive to determining that the data error has occurred for the storage device installed in the given drive bay.

12. The apparatus of claim 1 wherein determining status information for the given drive bay comprises determining whether a storage device installed in the given drive bay meets one or more specifications for a software-defined storage pool, and wherein controlling the one or more status indicators comprises selectively illuminating at least one indicator on the plate responsive to determining that the storage device installed in the given drive bay meets the one or more specifications for the software-defined storage pool.

13. The apparatus of claim 1 wherein determining status information for the given drive bay comprises determining whether a storage device installed in the given drive bay is ready for at least one of removal and replacement, and wherein controlling the one or more status indicators comprises selectively illuminating at least one indicator on the plate responsive to determining that the storage device installed in the given drive bay is ready for at least one of removal and replacement.

14. A computer program product comprising a non-transitory processor-readable storage medium having stored therein program code of one or more software programs, wherein the program code when executed by at least one processing device causes the at least one processing device to perform steps of:
determining status information for a given one of one or more drive bays in a housing of a drive bay enclosure of a storage system, the housing of the drive bay enclosure comprising:
a spindle comprising one or more lights;
one or more status indicators proximate an opening for the given drive bay; and
a plate configurable to cover at least a portion of the opening for the given drive bay, the plate comprising at least one of the one or more status indicators; and
controlling the one or more status indicators proximate the opening for the given drive bay based at least in part on the determined status information, wherein controlling the one or more status indicators comprises selectively activating respective ones of the one or more lights of the spindle to passively illuminate at least a portion of the plate.

15. The computer program product of claim 14 wherein the plate comprises at least one of a turnover plate rotatably mounted to the spindle proximate the opening for the given drive bay, a filler plate installed in the opening for the given drive bay, and a drive tray plate installed in the opening for the given drive bay.

16. The computer program product of claim 14 wherein determining status information for the given drive bay comprises determining a status of a storage device installed in the given drive bay with respect to one or more software-defined storage pools, and wherein controlling the one or more status indicators comprises selectively illuminating at least one indicator on the plate responsive to determining the status of the storage device installed in the given drive bay with respect to the one or more software-defined storage pools.

17. A method comprising:
determining status information for a given one of one or more drive bays in a housing of a drive bay enclosure of a storage system, the housing of the drive bay enclosure comprising:
a spindle comprising one or more lights;
one or more status indicators proximate an opening for the given drive bay; and
a plate configurable to cover at least a portion of the opening for the given drive bay, the plate comprising at least one of the one or more status indicators; and
controlling the one or more status indicators proximate the opening for the given drive bay based at least in part on the determined status information, wherein controlling the one or more status indicators comprises selectively activating respective ones of the one or more lights of the spindle to passively illuminate at least a portion of the plate;
wherein the method is performed by at least one processing device comprising a processor coupled to a memory.

18. The method of claim 17 wherein the plate comprises at least one of a turnover plate rotatably mounted to the spindle proximate the opening for the given drive bay, a filler plate installed in the opening for the given drive bay, and a drive tray plate installed in the opening for the given drive bay.

19. The method of claim 17 wherein determining status information for the given drive bay comprises determining a status of a storage device installed in the given drive bay with respect to one or more software-defined storage pools, and wherein controlling the one or more status indicators comprises selectively illuminating at least one indicator on the plate responsive to determining the status of the storage device installed in the given drive bay with respect to the one or more software-defined storage pools.

20. The apparatus of claim 1 wherein the plate comprises a control circuit board configured for coupling to at least one of the one or more lights of the spindle.

* * * * *